US011587852B2

(12) United States Patent
Shilimkar et al.

(10) Patent No.: US 11,587,852 B2
(45) Date of Patent: Feb. 21, 2023

(54) POWER AMPLIFIER MODULES WITH FLIP-CHIP AND NON-FLIP-CHIP POWER TRANSISTOR DIES

(71) Applicant: NXP USA, Inc., Austin, TX (US)

(72) Inventors: Vikas Shilimkar, Chandler, AZ (US); Ramanujam Srinidhi Embar, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/205,390

(22) Filed: Mar. 18, 2021

(65) Prior Publication Data

US 2022/0115298 A1  Apr. 14, 2022

Related U.S. Application Data

(63) Continuation-in-part of application No. 17/068,051, filed on Oct. 12, 2020.

(51) Int. Cl.
*H01L 23/485* (2006.01)
*H01L 23/552* (2006.01)
*H01L 23/00* (2006.01)
*H01L 29/06* (2006.01)

(52) U.S. Cl.
CPC .......... *H01L 23/485* (2013.01); *H01L 23/552* (2013.01); *H01L 24/81* (2013.01); *H01L 29/0696* (2013.01)

(58) Field of Classification Search
None
See application file for complete search history.

(56) References Cited

U.S. PATENT DOCUMENTS

| | | |
|---|---|---|
| 7,166,898 B2 | 1/2007 | Briere |
| 7,290,864 B2 | 11/2007 | King |
| 9,064,947 B2 | 6/2015 | Roberts et al. |
| 9,653,410 B1 | 5/2017 | Holmes et al. |
| 9,727,254 B2 | 8/2017 | Jeon |
| 9,800,209 B2 | 10/2017 | Li |
| 9,960,145 B2 | 5/2018 | Costa et al. |
| 10,075,132 B2 | 9/2018 | Jones et al. |

(Continued)

FOREIGN PATENT DOCUMENTS

EP    3428971 A1    1/2019

OTHER PUBLICATIONS

Non Final Office Action; U.S. Appl. No. 17/068,051; 8 pages (dated Mar. 11, 2022).

(Continued)

*Primary Examiner* — Long Pham

(57) ABSTRACT

An amplifier module includes a module substrate and first and second power transistor dies. The first power transistor die is coupled to a mounting surface of the module substrate, and has first and second input/output (I/O) contact pads and a first ground contact pad, all of which are all exposed at a surface of the first power transistor die that faces toward the mounting surface of the module substrate. The second power transistor die also is coupled to the mounting surface, and has third and fourth I/O contact pads and a second ground contact pad. The third and fourth I/O contact pads are exposed at a surface of the second power transistor die that faces away from the mounting surface of the module substrate, and the second ground contact pad is exposed at a surface of the second power transistor die that faces toward the mounting surface.

20 Claims, 15 Drawing Sheets

(56) References Cited

U.S. PATENT DOCUMENTS

| | | | |
|---|---|---|---|
| 10,594,276 | B2 | 3/2020 | Jones et al. |
| 10,734,303 | B2 | 8/2020 | Odnoblyudov et al. |
| 2002/0185675 | A1 | 12/2002 | Furukawa |
| 2004/0245638 | A1 | 12/2004 | Nemtsev et al. |
| 2010/0109052 | A1 | 5/2010 | Nakajima et al. |
| 2012/0012945 | A1 | 1/2012 | Inoue |
| 2014/0070881 | A1 | 3/2014 | Annes et al. |
| 2017/0077051 | A1 | 3/2017 | Sanders et al. |
| 2018/0006611 | A1 | 1/2018 | de Jong et al. |
| 2018/0226506 | A1 | 8/2018 | Chang et al. |
| 2020/0118922 | A1 | 4/2020 | Hill |
| 2021/0021237 | A1 | 1/2021 | Schultz et al. |
| 2021/0202408 | A1 | 7/2021 | Khalil et al. |
| 2021/0265473 | A1 | 8/2021 | Yamaguchi et al. |
| 2021/0313293 | A1 | 10/2021 | Noori et al. |

OTHER PUBLICATIONS

Notice of Allowance; U.S. Appl. No. 16/984,286; 9 pages (dated Mar. 22, 2022).

U.S. Appl. No. 17/007,175; not yet published; 45 pages (filed Aug. 31, 2020).

U.S. Appl. No. 16/984,286; not yet published; 21 pages (filed Aug. 4, 2020).

U.S. Appl. No. 17/068,051; not yet published; 31 pages (filed Oct. 12, 2020).

Hill, Darrell et al; "28-V Low Thermal-Impedance HBT With 20-W CW Output Poser"; IEEE Transactions on Microwave Theory and Techniques, vol. 45, No. 12; 5 pages (Dec. 1997).

Hill, Darrell, et al; "Three-Dimensional MMIC Architecture Using Low Thermal Impedance Technology"; IEEE MTT-S Digest; 4 pages (1998).

Xu, Jane; "GaN HEMTs based Flip-chip Integrated Broadband Power Amplifier"; University of California at Santa Barbara, ONR MURI Center Impact—Innovative Microwave Power Amplifier Consortium Center; retrieved from the Internet https://my.ece.ucsb.edu/Mishra/ganitrideelec/xudefense.pdf; 72 pages (Dec. 2000).

Kuo, Che-Chjung et al; "A 3.5-GHz SiGe 0.35um HBT Flip-Chip Assembled on Ceramics Integrated Passive Device Doherty Power Amplifier for SiP Integration"; Proceedings of the Asia-Pacific Microwave Conference 2011; 4 pages (2011).

Notice of Allowance; U.S. Appl. No. 17/068,051; 5 pages (dated Jul. 18, 2022).

U.S. Appl. No. 16/984,286; Non Final Office Action; 10 pages (dated Oct. 20, 2021).

U.S. Appl. No. 16/984,286; NFOA; 9 pages (Oct. 20, 2021).

POWER AMPLIFIER MODULES WITH FLIP-CHIP AND NON-FLIP-CHIP POWER TRANSISTOR DIES

CROSS-REFERENCE TO RELATED APPLICATION

This application is a continuation-in-part of co-pending, U.S. patent application Ser. No. 17/068,051, filed on Oct. 12, 2020, and entitled "Transistor with Flip-Chip Topology and Power Amplifier Containing Same."

TECHNICAL FIELD OF THE INVENTION

The present invention relates generally to semiconductor devices. More specifically, the present invention relates to power amplifiers having transistors with flip-chip topologies.

BACKGROUND OF THE INVENTION

A power amplifier typically includes a module substrate and at least one radio frequency (RF) power transistor die, which is mounted to the module substrate in an upright or non-inverted orientation. The module substrate may be, for example, a printed circuit board (PCB), a ceramic substrate, or another substrate having electrically-conductive routing features with which the RF power transistor die is electrically interconnected. A given power amplifier may contain a single RF power transistor die or multiple RF power transistor dies in addition to any number of other microelectronic components, such as discretely-placed capacitors and resistors.

By conventional design, an RF power transistor die often includes a metallized backside serving as a backside contact (e.g., ground) of the RF power transistor die, which is electrically coupled to a corresponding terminal of a transistor circuit integrated into the die. For example, in the case of a field effect transistor (FET), the source terminal of the FET may be electrically coupled to ground through such a backside contact. Contacts to the other terminals of the transistor (e.g., the gate and drain terminals in the case of the FET) may be formed as input and output bond pads located on the frontside of the RF power transistor die and, specifically, formed in an outer terminal surface of a multi-layer system formed over the frontside of the die body. When installed within a given system (e.g., a power amplifier), wire bonds may be formed between the frontside input and output bond pads and corresponding electrical routing features of the module substrate to complete electrical interconnection of the RF power transistor die.

SUMMARY

Aspects of the disclosure are defined in the accompanying claims.

In a first aspect, there is provided an amplifier module that includes a module substrate and first and second power transistor dies. The module substrate has a mounting surface and a plurality of conductive features at the mounting surface. The first power transistor die is coupled to the mounting surface, and has first and second input/output (I/O) contact pads and a first ground contact pad. The first and second I/O pads and the first ground contact pad all are exposed at a first surface of the first power transistor die that faces toward the mounting surface of the module substrate. The second power transistor die also is coupled to the mounting surface, and has third and fourth I/O contact pads and a second ground contact pad. The third and fourth I/O contact pads are exposed at a first surface of the second power transistor die that faces away from the mounting surface of the module substrate, and the second ground contact pad is exposed at a second surface of the second power transistor die that faces toward the mounting surface of the module substrate.

In a second aspect, there is provided a Doherty amplifier module that includes a module substrate, a first amplifier path, a second amplifier path, and a combining node. The module substrate has a mounting surface and a plurality of conductive features at the mounting surface. The first amplifier path includes a first input, a first output, and a first power transistor die coupled to the mounting surface. The first power transistor die has a first I/O contact pad coupled to the first input, a second I/O contact pad coupled to the first output, and a first ground contact pad all exposed at a first surface of the first power transistor die that faces toward the mounting surface of the module substrate. The second amplifier path includes a second input, a second output, and a second power transistor die coupled to the mounting surface. The second power transistor die has a third I/O contact pad coupled to the second input, a fourth I/O contact pad coupled to the second output, and a second ground contact pad. The third and fourth I/O contact pads are exposed at a first surface of the second power transistor die that faces away from the mounting surface of the module substrate, and the second ground contact pad is exposed at a second surface of the second power transistor die that faces toward the mounting surface of the module substrate. The combining node is electrically coupled to the first and second outputs of the first and second amplifier paths.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
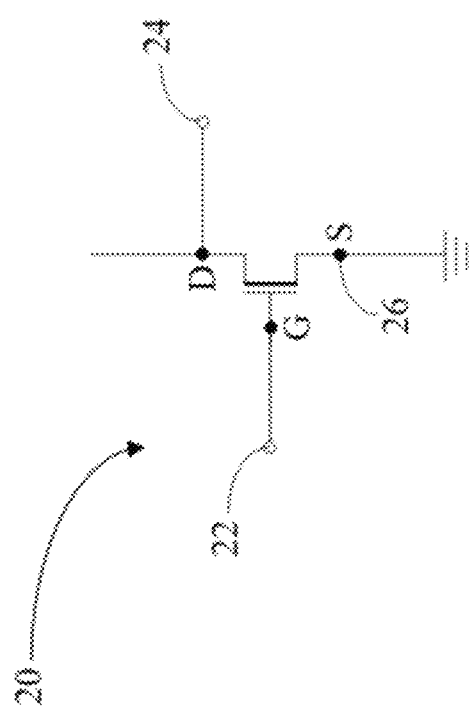
FIG. 1 shows a schematic of a common source FET device configuration.

In overview, embodiments disclosed herein entail semiconductor devices and power amplifier systems/modules, and more specifically transistor devices having a flip-chip topology and power amplifiers in which such flip-chip transistor devices are incorporated. The transistor devices are implemented in semiconductor dies (referred to herein as a "power transistor dies"), and the transistor-bearing semiconductor dies may be physically and electrically coupled to module substrates. The layouts of embodiments of the transistor devices enable interconnection of transistor input, output, and source terminals through a frontside input/output (I/O) interface. Electrical interconnections between contact pads contained in the die's frontside I/O interface and the corresponding electrical routing features of a module substrate may be formed utilizing electrically conductive connection elements, such as solder balls or electrically-conductive pillars, to avoid the usage of wire bonds. The layouts of embodiments of the transistor devices enable the effective utilization of gaps between transistor fingers to create contact pads for source regions, thereby resulting in a compact transistor. Further, the topology enables vertical flow of source currents through patterned electrically conductive material and electrically conductive vertical connections (e.g., vias) extending from the frontside of the die body through an interconnect structure to provide a low impedance path to ground. Additionally, the arrangement of the typically grounded source contacts between input and output contact pads may provide effective isolation between the input and outputs of the power transistor dies. Such flip-chip semiconductor devices may be well-suited for incorporation into a power amplifier, e.g., a modular electronic assembly, containing at least one radio frequency (RF) power transistor die utilized for power or signal amplification purposes. When so incorporated, a given flip-chip semiconductor device may be mounted to a module substrate, such as a printed circuit board (PCB) or a ceramic substrate, in an inverted orientation such that the frontside I/O interface of the semiconductor device faces the die support surface of the module substrate. Additional transistor devices (i.e., transistor-bearing dies) also may be mounted to the module substrate, and those additional transistor devices may have flip-chip and/or non-flip-chip topologies.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, upper and lower, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Referring to FIG. 1, FIG. 1 shows a schematic of a common source field-effect transistor (FET) device configuration 20. In common source FET configuration 20, the gate, G, serves as an input port 22 (e.g., signal input or control), and the drain, D, serves as an output port 24 (e.g., signal output or current supply). The source, S, serves as a common connection 26 (e.g., ground or reference voltage) in common source configuration 20 since it is the FET lead or terminal which is grounded as shown in FIG. 1. Thus, common source configuration 20 is an example of a two-port active device in which two of the three leads/terminals of the FET (i.e., the gate terminal and the drain terminal) serve as the input and output ports and the third lead/terminal (i.e., the source terminal) is utilized as the common connection. For clarity of discussion, transistor layouts discussed herein have common source configuration 20. However, the following discussion applies equivalently to other two-port active semiconductor device configurations in which, for example, the gate may serve as the common connection or the drain may serve as the common connection.

Figure 2:
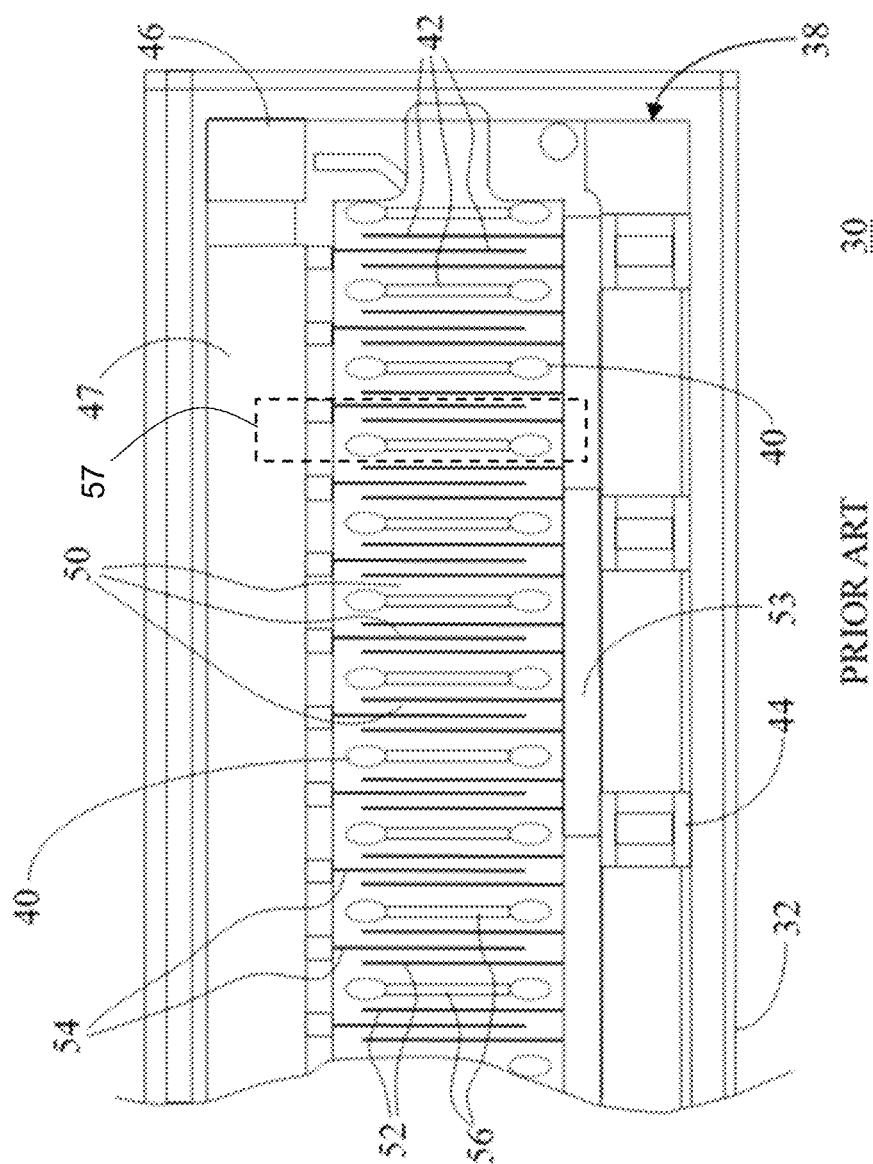
FIG. 2 shows a partial plan view of a layout of a prior art semiconductor device.
Figure 3:
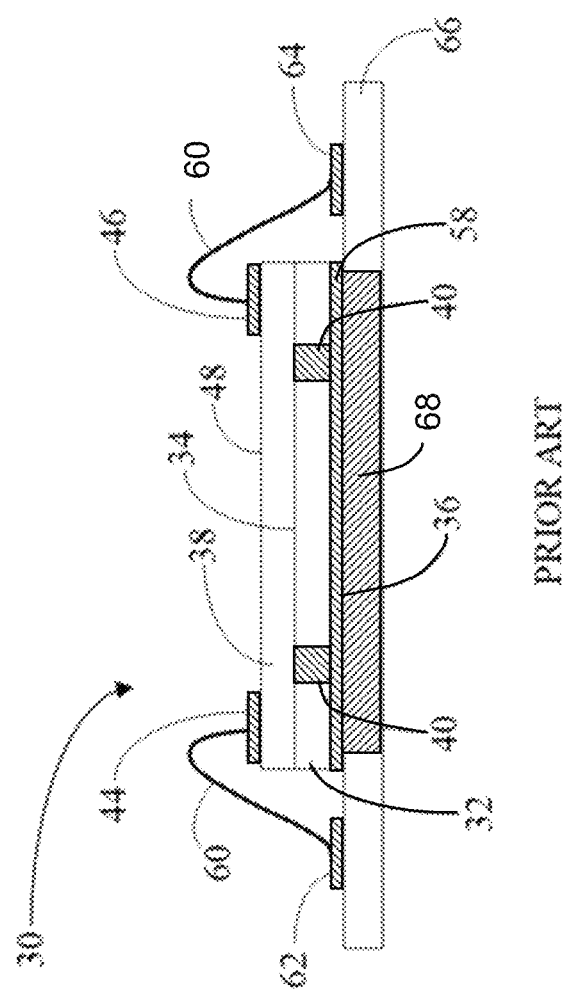
FIG. 3 shows a side view of the prior art semiconductor device of FIG. 2.

Referring to FIGS. 2 and 3, FIG. 2 shows a partial plan view of a layout of a prior art, "non-flip-chip" semiconductor device or die 30 and FIG. 3 shows a simplified side view of semiconductor device 30. That is, semiconductor device 30 is an example of a conventional die arrangement. Semiconductor device 30 includes a base semiconductor substrate 32 (also referred to as a base substrate or die body) having upper and lower surfaces 34, 36, respectively (see FIG. 3). The base substrate 32 may be formed from semiconductor materials including but not limited to silicon, gallium nitride (GaN), silicon germanium (SiGe), or combinations thereof. In some cases, the semiconductor materials may be formed on or include an insulating material (e.g., the base semiconductor substrate 32 may be a silicon-on-insulator (Sop) substrate).

A build-up structure or frontside layer system, referred to herein as an interconnect structure 38, is formed over the upper surface of base substrate 32. Interconnect structure 38 may include patterned electrically conductive material layers alternately arranged with dielectric material layers, along with electrically conductive vertical connections (i.e., conductive vias) extending from upper surface 34 of base substrate 32 through interconnect structure 38. Electrical connections between upper and lower surfaces 34, 36 of base substrate 32 may be made using conductive through substrate vias (TSVs). In the illustrated configuration, semiconductor device 30 includes a plurality of source vias 40. Source vias 40 are represented as dotted ovals in FIG. 2 and as dotted columns in FIG. 3 because source vias 40 may not extend into or entirely through the overlying interconnect structure 38 of semiconductor device 30 and are therefore not visible in the top view of FIG. 2.

Semiconductor device 30 includes an active area (e.g., transistor) that includes a plurality of alternatingly-arranged, elongated, doped, drain and source semiconductor regions in the base substrate 32, along with elongated channel regions 50 located between adjacent drain and source regions. Gate structures are formed over the channel regions above the upper surface 34 of the base substrate 32 between the doped drain and source regions. A plurality of parallel, elongated transistor contacts 42 extend generally between conductive gate and drain manifolds 53, 47, which in turn are electrically coupled to respective gate and drain bond pads 44, 46 of semiconductor device 30. In this example, gate and drain bond pads 44, 46 are positioned at or on a topside outer portion or upper surface 48 (see FIG. 3) of interconnect structure 38. These gate and drain bond pads 44, 46 are suitably electrically connected to contacts 42 through the gate and drain manifolds 53, 47, which are formed in the patterned electrically conductive material (not shown) of interconnect structure 38. Additionally, as mentioned above, semiconductor device 30 includes a plurality of channel regions 50 in the base substrate 32 that underly the gate structures, where channel regions 50 particularly include doped or undoped semiconductor material in the spaces between adjacent drain and source regions and neighboring ones of contacts 42. In semiconductor device 30, contacts 42 include a plurality of elongated gate contacts 52, a plurality of elongated drain contacts 54, and a plurality of elongated source contacts 56.

Elongated conductive gate contacts 52 are electrically coupled to the gate structures that overlie the channel regions 50. The gate contacts 52 extend from a conductive gate manifold 53, which is electrically coupled to one or more gate bond pads 44, toward (but not to) a conductive drain manifold 47, which is electrically coupled to one or more drain bond pad(s) 46. Elongated conductive drain contacts 54 extend from the drain manifold 47, which is electrically coupled to the one or more drain bond pad(s) 46, toward (but not to) the gate manifold 53, which is electrically coupled to the one or more gate bond pads 44. Gate contacts 52 may overlie channel regions 50, and gate manifold 53 electrically interconnects all of the plurality of elongated gate contacts 52. In other arrangements, multiple gate manifolds may be implemented, where each gate manifold electrically connects a subset of the gate contacts to one or more gate bond pads 44. Elongated drain contacts 54 generally extend over the doped drain semiconductor regions along the sides of channel regions 50, and drain manifold 47 electrically interconnects all of the elongated drain contacts 54 to the drain bond pad(s) 46. Each of elongated source contacts 56 is electrically coupled between the doped source semiconductor regions and one or more of source vias 40, and source vias 40 are positioned adjacent to gate contacts 52. Each of source vias 40 extends through base substrate 32 to provide a conductive path between one or more of source contacts 56 that are coupled to the respective source via(s) 40 and lower surface 36 of semiconductor device 30 (e.g., and to a conductive layer 58, see FIG. 3, on lower surface 36 of semiconductor device 30 that serves as a ground reference). Accordingly, electrical connections to the gate structures (through gate bond pads 44, gate manifold 53, and gate contacts 52) and to the drain regions (through drain bond pad(s) 46, drain manifold 47, and drain contacts 54) are made at the upper surface 48 of the device 30 (i.e., through gate and drain bond pads 44, 46), and electrical connection to the source regions (through conductive layer 58, source vias 40, and source contacts 56) are made at the lower surface 36 of the device 30 (i.e., through conductive layer 58).

As used herein, the "source-to-drain pitch" refers to the distance (in a horizontal direction in FIG. 2) between the centers of neighboring ones of source contacts 56 and drain contacts 54. As used herein, a transistor "finger" includes a combination of adjacent source, channel, and drain regions, along with their associated source, gate, and drain contacts (e.g., as surrounded by box 57). In FIG. 2, semiconductor device 30 includes a plurality of transistor fingers. Additionally, a transistor "finger" can also be considered to be a grouping of a neighboring pair of a source contact and a drain contact on a die, and the "source-to-drain pitch" can accordingly also refer to the distance (in a horizontal direction) between the centers of a pair of source and drain contacts of a given transistor finger.

With particular reference to FIG. 3, when installed within a given system, the conductive layer 58 is coupled to a conductive ground feature (e.g., grounded conductive traces, vias, or an embedded coin 68 of the module substrate 66), and wirebonds 60 may be formed between the frontside bond pads (e.g., gate and drain bond pads 44, 46) and corresponding electrical routing features 62, 64 of a secondary structure (e.g., a module substrate 66) to complete electrical interconnection of semiconductor device 30 within the system. Because wirebonds 60 are used to provide electrical connectivity to the die 30, non-flip-chip die 30 alternatively may be referred to as a "wirebond die."

High-efficiency power amplifier (PA) design is increasingly becoming an integral part of wireless communication systems. Indeed, the cellular base station market is slowly transitioning from silicon (Si) to gallium-nitride (GaN) based radio frequency (RF) products that are expected to be suitable for fifth generation (5G) communications. In many implementations that employ Doherty PA circuits or other multi-path PA circuits, the physical die area is of key concern, as power transistor products included in commercial wireless infrastructure systems have become increasingly cost-sensitive as well as area/volume/weight sensitive. With GaN technology, this is particularly important as the technology per square millimeter is significantly more expensive than that of silicon or other III-V based semiconductors. Because GaN is not manufactured on a native substrate, lattice mismatch prevents growing wafer size beyond approximately six inches in diameter. Accordingly, each GaN wafer tends to yield fewer power transistor die than are typically achievable using Si wafer technology.

Unfortunately, wire-bonding processes can be a time consuming, hence costly, assembly processes. Furthermore, the overall transistor size including wirebonds 60 to transfer power to/from semiconductor device 30 is critical to PA circuit size. That is, a wire-bonded semiconductor die consumes extra space due to the presence of wirebonds 60.

Further, losses and coupling/radiation due to the wire bond interconnections (e.g., wirebonds 60) can result in an RF performance penalty of a PA, particularly a PA that includes multiple semiconductor devices. Still further, a wire-bonded semiconductor die typically requires the presence of through substrate vias (TSVs) (e.g., source vias 40) through the base substrate, in a direction away from interconnect structure 38, to a backside metallized source terminal (e.g., conductive layer 58). The inclusion of TSVs within some semiconductor devices is associated with additional limitations. TSV formation often adds considerable cost and duration to manufacturing processes. Additionally, TSV formation may increase the likelihood of die cracking or other structural compromise of power transistor dies, which can potentially decrease yield and increase average per-die manufacturing costs.

Embodiments discussed herein entail a flip-chip transistor topology that avoids the usage of wirebonds and source TSVs, enables a reduction in area consumption due to the absence of the wirebonds, yields a more robust mechanical structure, while having little to no RF performance penalty relative to wire bonded semiconductor devices. Additionally, cost savings may be realized by eliminating the process steps associated with TSV formation, while manufacturing yield may be improved due to a reduced likelihood of die cracking during IC fabrication.

Figure 4:
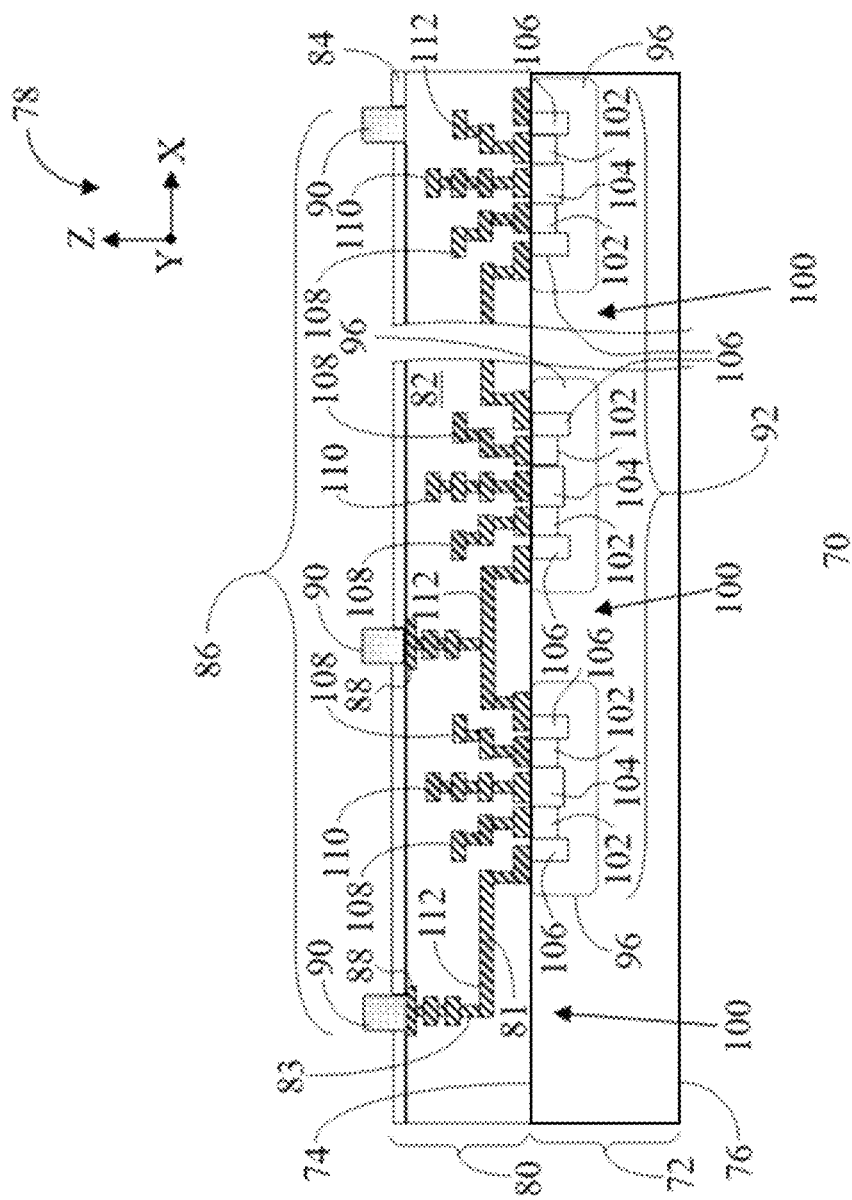
FIG. 4 shows a simplified cross-sectional side view of a semiconductor device having a flip chip topology in accordance with an embodiment.

FIG. 4 shows a simplified cross-sectional side view of a semiconductor device 70 having a flip chip topology in accordance with an embodiment. Semiconductor device 70 may be, for example, a radio frequency (RF) power transistor die that may, in some embodiments, be implemented in a power amplifier (discussed in connection with FIGS. 8-15). Semiconductor device 70 includes a base semiconductor substrate 72 (also referred to herein as a die body or base substrate) having a frontside 74 and an opposing backside 76. The base substrate 72 may be formed from semiconductor materials including but not limited to silicon, GaN, SiGe, or combinations thereof. In some cases, the semiconductor materials may be formed on or include an insulating material (e.g., the base semiconductor substrate 72 may be a silicon-on-insulator (Sop substrate). According to an embodiment, the base substrate 72 (and thus the semiconductor device 70) does not include TSVs (e.g., source vias 40, FIG. 3).

Frontside 74 and backside 76 of the base substrate 72 are spaced along a vertical axis of semiconductor device 70, which extends substantially orthogonal to frontside 74 and corresponds to the Z-axis of a coordinate legend 78 appearing in the upper right corner of FIG. 4. An interconnect structure 80, alternatively referred to as a "build-up structure" or "frontside layer system," contains a number of layers of patterned electrically conductive material layers 81 (e.g., metal layers) alternately arranged with dielectric material layers, along with electrically conductive vertical connections 83 (e.g., metal plugs or vias) and is integrally formed with the base substrate 72 by build-up over frontside 74. Patterned conductive material 81 and vertical connections 83 are represented by upward and rightward directed hatching for clarity of illustration. Interconnect structure 80 can include any practical number of layers of patterned conductive material 81 greater than one and may commonly contain between three and five layers of patterned conductive material formed at different levels or elevations along a vertical axis (again, defined herein as an axis extending orthogonal to frontside 74 and parallel to the Z-axis of coordinate legend 78).

Terms of relative positioning, such as "above" and "beneath," are utilized below to describe the various features formed within interconnect structure 80. Such terms are defined in relation to relative proximity to frontside 74 of base substrate 72 such that, for example, a first feature or element may be described as located at a level "above" a second feature or element when the second feature is located closer to base substrate frontside 74 than is the first feature. Similarly, the terms "over" and "overlie" are utilized throughout this document to describe the relative positioning between two features or elements sharing a vertically overlapping relationship, as taken along a vertical axis. Thus, as an example, interconnect structure 80 is described as formed over or overlying frontside 74 of base substrate 72 regardless of the particular orientation of semiconductor device 70 in free space.

As previously indicated, the number of patterned conductive material layers included in interconnect structure 80 will vary between embodiments. In the illustrated embodiment, and by way of non-limiting example, interconnect structure 80 is schematically depicted as containing five patterned conductive material layers. By common nomenclature, these patterned conductive material layers may be referred to as the "M1" through "M5" patterned conductive material layers, with the descriptor "M1" referring to the initially-formed layer of patterned conductive material 81, the descriptor "M2" referring to the next layer of patterned conductive material 81 formed after the M1 patterned conductive material 81, the descriptor "M3" referring to the layer of patterned conductive material 81 formed after the M2 patterned conductive material 81, and so on. Further, in keeping with the foregoing description, the M1 patterned conductive material 81 may be referred to as the "innermost" or "inner" layer of patterned conductive material 81 herein, while the M5 patterned conductive material 81 may be referred to as the "outermost" or "outer" layer of patterned conductive material 81. The layers of patterned conductive material 81 and vertical connections 83 are surrounded by layers of dielectric material, which collectively form a dielectric body of interconnection structure 80 generally identified by reference numeral "82" in FIG. 4. Dielectric body 82 may also include at least one outer terminal dielectric layer 84, which serves as a solder mask or as a passivation layer.

A frontside I/O interface 86 is further provided along the outer terminal surface of interconnect structure 80 (commonly referred to as the "frontside" of semiconductor device 70) and includes a number of contact pads 88, which provide electrical connection to the different terminals of a transistor IC integrated into semiconductor device 70, as further discussed below. Semiconductor device 70 may additionally include electrically conductive connection elements 90 (e.g., pillars, solder balls, or other such contact extensions) formed on contact pads 88 configured for flip-chip bonding to a secondary structure, as will be discussed in greater detail below. As used herein, the term "contact pad" means a conductive feature exposed at a surface of a semiconductor die, and to which external circuitry may be connected. Essentially, a "contact" is a low resistivity conductive feature (or low resistivity series of electrically connected features) that is electrically connected between a transistor gate, drain, or source and a contact pad.

Figure 5:
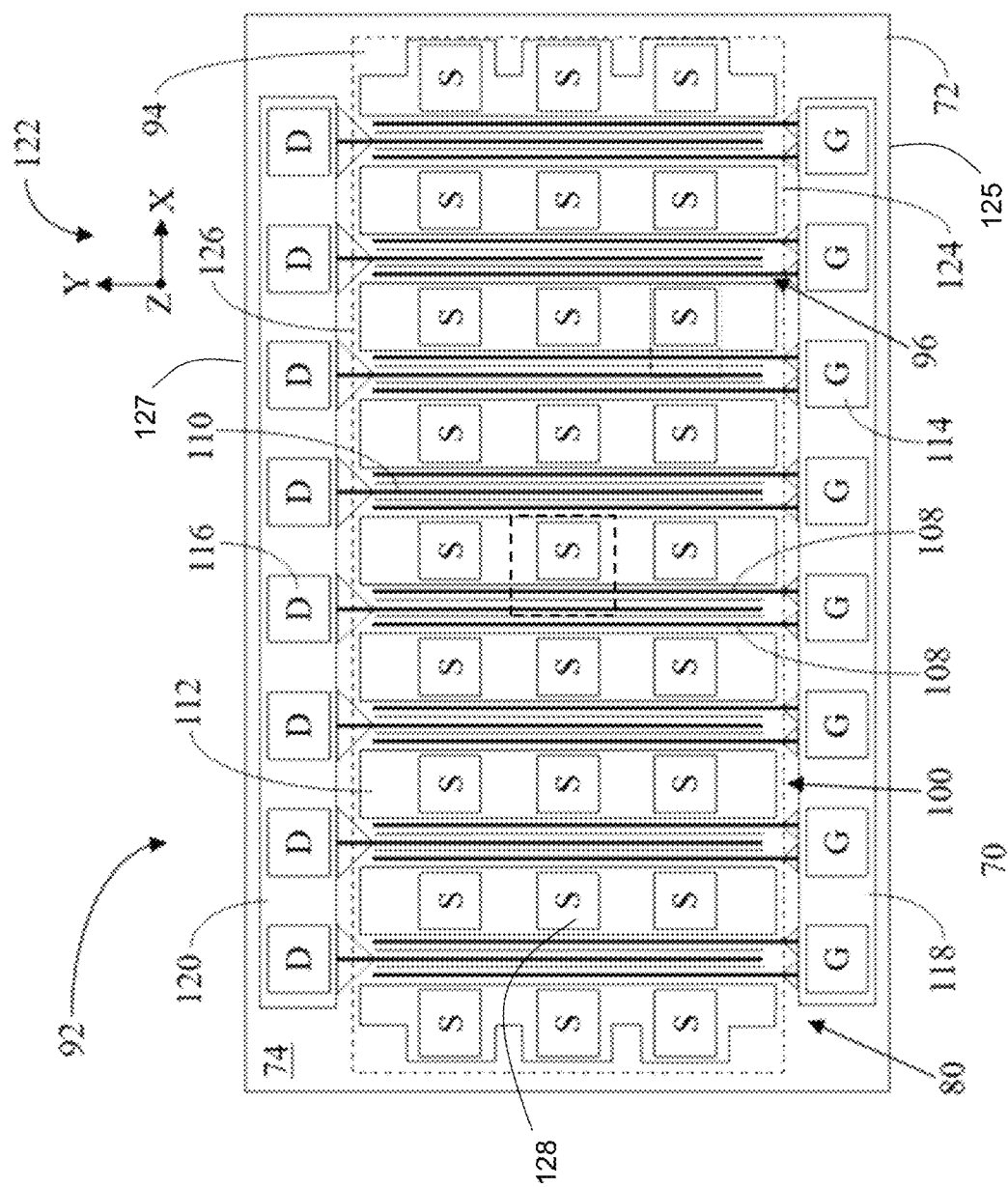
FIG. 5 shows a simplified plan view of the semiconductor device of FIG. 4.

Referring momentarily to FIG. 5 in connection with FIG. 4, FIG. 5 shows a simplified plan view of transistor integrated circuit (IC), referred to herein as a transistor 92, that may be implemented in semiconductor device 70. Transistor 92 has an active area 94 formed in base substrate 72 in which active area 94 is bounded by an outer periphery. In FIG. 5, the outer periphery of active area 94 is generally delineated by a dashed line box. Further discussion of FIG. 5 will be provided below following the description of FIG. 4.

With reference back to FIG. 4, active area 94 (FIG. 5) of transistor 92 includes a plurality of active regions 96 in die body 72 constituting individual channels of transistor 92, with active regions 96 being spaced apart by inactive regions 100, also in die body 72. In the illustrated example of FIG. 4, active regions 96 are delineated by dotted line boxes and inactive regions 100 constitute the space between adjacent active regions 96.

In this example, the innermost (M1) layer of conductive materials 81 of interconnect structure 80 is patterned to define various electrically conductive (e.g., metal) features, which provide contact to active first, second, and third subregions 102, 104, 106 included in each active region 96 of transistor 92 formed in semiconductor device 70. When transistor 92 is a FET, the active transistor subregions will generally include doped source subregions 106 and doped drain subregions 104 formed in base substrate 72 at locations adjacent frontside 74 of base substrate 72; or, perhaps, buried beneath frontside 74 by some amount depending upon the nature of the implants used and the desired transistor topology. The term "active region 96," as appearing herein, also encompasses first subregions 102 of semiconductor material located between adjacent source and drain subregions 106, 104 and in which the transistor channel forms when transistor 92 begins conducting. As such, first subregions 102 may be referred to herein as channel subregions 102, second subregions 104 may be referred to herein as drain subregions 104, and third subregions 106 may be referred to herein as source subregions 106. Accordingly, active regions 96 of transistor 92 include channel, drain, and source subregions 102, 104, 106 within active area 94 (FIG. 5) of transistor 92 and inactive regions 100 are free of (e.g., "to lack" or "be devoid of") channel, drain, and source subregions 102, 104, 106.

In alternative implementations, the active transistor regions may include the emitter and collector regions when one or more bipolar transistors are integrated into semiconductor device. Generally, it may be stated that a transistor integrated circuit 92 or "transistor 92" is formed in semiconductor device 70. The term "transistor IC" is utilized to indicate that more than one transistor 92 may be integrated into semiconductor device 70 and/or additional circuit elements (e.g., impedance matching, harmonic termination, or biasing circuitry) may be formed in semiconductor device 70 in some configurations.

In the following description, transistor ICs containing a single FET (e.g., transistor 92) are discussed for purposes of explanation. In further embodiments, however, other types of transistors (e.g., bipolar transistors) may be integrated into semiconductor device 70 and/or more complex transistor ICs may be provided, such as multi-stage transistor ICs containing multiple transistors formed on a single semiconductor device, such as an RF power transistor die. Further, embodiments may be implemented with various different die technologies, transistor types, and transistor topologies. For example, when the transistor or transistors carried by semiconductor device 70 assume the form of a FET, the FET can be implemented utilizing any of the following die technologies: a silicon-based FET (e.g., a laterally-diffused metal oxide semiconductor FET or LDMOS FET, a SiGe FET, and so on) or a III-V FET (e.g., a GaN FET, a GaAs FET, a gallium phosphide (GaP) FET, an indium phosphide (InP) FET, or an indium antimonide (InSb) FET, or another type of III-V transistor.

Electrically-conductive routing or wiring features are formed in interconnect structure 80 to provide electrical interconnections from externally-exposed contact pads 88 to corresponding patterned features included in the M1 patterned metal layer and channel, drain, and source subregions 102, 104, 106 of transistor 92. These patterned features formed from conductive material 81 and vertical connections 83 are shown in a highly simplified form in the schematic of FIG. 4 and can vary in geometric complexity as required to best suit the layout of the transistor (or transistors) included in semiconductor device 70. When interconnect structure 80 contains three or more layers of patterned conductive material 81, relatively complex wiring schemes or architectures can be employed. Such architectures are generally known and will therefore not be discussed in depth in the description. However, at this juncture in the description, it may be generally noted that each type of contact pad included in contact pads 88 (e.g., gate, drain, and source contact pads) may be electrically coupled to a corresponding active channel, drain, or source subregion 102, 104, 106 of transistor 92 through a contact or an electrode structure extending through interconnect structure 80.

Specifically, and again referring to the example of a FET, a first type of input/output (I/O) contact pad (e.g., gate contact pads 114, FIG. 5) included in contact pads 88 may be electrically coupled to corresponding metal features included in or below the M1 patterned metal layer (e.g., the "gate terminals" overlying channel subregions 102 of transistor 92) through a first contact, referred to herein as a gate electrode structure 108 extending through interconnect structure 80. A second type of I/O contact pad (e.g., drain contact pads 116, FIG. 5) included in contact pads 88 may be electrically coupled to metal features included in the M1 patterned metal layer (e.g., the "drain terminals" providing ohmic contact to doped drain subregions 104 of transistor 92) through a second contact, referred to herein as a drain electrode structure 110 extending through interconnect structure 80. Finally, a third type of ground contact pad (e.g., source contact pads 128, FIG. 5) included in contact pads 88 (e.g., one or more source contact pads) may be electrically coupled to corresponding metal features included in the M1 patterned metal layer (e.g., the "source terminals" or the "source metal" providing contact to doped source subregions 106 of transistor) through a third contact, referred to herein as a source electrode structure 112 extending through interconnect structure 80.

In the above-described manner, frontside I/O interface 86 is formed in an outer region (i.e., at the upper surface in the orientation of FIG. 4) of interconnect structure 80 to enable electrical connection to transistor 92 when semiconductor device 70 is integrated into a larger device or module, such as a power amplifier. In certain cases, additional non-illustrated contact pads may be included in frontside I/O interface 86 to support other electrical connections associated with operation of transistor 92, such as contact pads providing electrical connections for gate and/or drain biasing of one or more FETs. Several benefits are achieved by virtue of such a transistor topology and integrated wiring scheme, which jointly provide exclusive connection to all transistor terminals through frontside I/O interface 86. Unique frontside wiring structures or topologies, combined with unique complementary transistor layouts, enable the provision of such a frontside I/O interface 86 including at least one signal input or control contact and contact pad (e.g., one or more gate contact pads in the case of a FET), at least one signal output or current supply contact and contact pad (e.g., either drain or source contact pad(s) in the case of FET, depending on whether the FET is an N-channel or P-channel device), and at least one ground or current return contact and contact pad (e.g., again, either drain or source contact pad(s) in the case of FET, depending on whether the FET is an N-channel or P-channel device). The signal input and signal output contact pads may be referred to generically as "input/output contact pads" or "I/O contact pads."

Die body 72 of semiconductor device 70 may be wholly composed of a single semiconductor material when semiconductor device 70 is produced utilizing a singulated piece of a bulk semiconductor wafer, such as a bulk Si wafer. For example, in this case, die body 72 may be composed of a high resistivity Si material having an electrical resistivity exceeding about 520Ω per cm and, perhaps, approaching or exceed 1 mega-Ω per cm. In other instances, semiconductor device 70 may be fabricated utilizing a layered die technology of a type enabling relatively high transistor power densities. An example of such a power dense die technology is a layered GaN structure in which one or more layers of a GaN material (that is, a semiconductor material containing GaN as its primary constituent, by weight) are formed over one or more substrate layers of another material, such as silicon carbide (SiC). Other examples of layered die technologies suitable for producing die body 72 of semiconductor device 70 include GaAs structures, which likewise support the formation of transistor ICs (e.g., transistor 92) having relatively high power densities. As is the case when die body 72 is composed of a high resistivity Si (or other bulk semiconductor) material, such layered die technologies also typically possess relatively high electrical resistances exceeding 520Ω per cm taken through the thickness of the layered die structure; that is, in the case of die body 72, along the centerline or a vertical axis parallel to the Z-axis of coordinate legend 78.

In conventional RF power transistor die designs fabricated utilizing high electrical resistance die structures and providing an electrical grounding (current return) path through the backmetal structure (e.g., the backmetal structure 53, FIG. 3, which is electrically connected to the source terminal in the case of a FET), TSVs (e.g., TSVs 40, FIG. 3) are typically utilized to provide electrical connection between the corresponding doped (e.g., source) regions of the transistor and the backmetal structure. As previously discussed, TSV formation tends to add complexity and cost to the die fabrication process; and, in some instances, may decrease manufacturing yield due to an increased likelihood of crack formation or other structural compromise in the case of certain (e.g., thinner) die structures, depending upon process parameters (e.g., thermal exposures) and other factors. By leveraging unique transistor layouts and integrated wiring strategies within interconnect structure 80, the flip-chip topology of semiconductor device 70 can be fabricated to have a TSV-free construction (or, perhaps, to contain a reduced number of TSVs) to improve manufacturing efficiency, lower manufacturing cost, and boost yield, while providing other performance benefits discussed below.

Referring collectively to FIGS. 4-5, as mentioned previously, FIG. 5 shows a simplified plan view of transistor 92 that may be implemented in semiconductor device 70. Transistor 92 includes die body 72 and the overlying interconnect structure 80. In this illustration, dielectric body 82 of interconnect structure 80 is not shown so as to better visualize the various features within interconnect structure 80.

Active area 94 of transistor 92 includes active regions 96 and inactive regions 100, as discussed above. Gate and drain contact pads 114, 116 (represented by "G" and "D" in FIG. 5) of the generally referenced contact pads 88 (shown in FIG. 4) are contained in frontside I/O interface 86 formed in the outer portion of interconnect structure 80 of semiconductor device 70. In some embodiments, the plurality of gate contact pads 114 may be replaced with one or more elongated contact pads that extend the width of the active area 94, and/or the plurality of drain contact pads 116 may be replaced with one or more elongated contact pads that extend the width of the active area 94. A plurality of parallel, elongated transistor contacts (also referred to as runners) extend between respective gate and drain contact pads 114, 116. In some embodiments, the gate contact pads 114 may be electrically interconnected through an elongated gate manifold 118, and the drain contact pads 116 may be electrically interconnected through an elongated drain manifold 120. In semiconductor device 70, the elongated transistor contacts include first, second, and third contacts 108, 110, 112, which are alternatively referred to herein as gate, drain, and source electrode structures 108, 110, 112 when transistor 92 is a FET. As such, gate and drain contact pads 114, 116 are suitably electrically connected to respective gate and drain electrode structures 108, 110 within interconnect structure 80.

Elongated gate electrode structures 108 (e.g., runners) extend from one or more gate contact pads 114 (and gate manifold 118) through interconnect structure 80 toward (but not to) one or more drain contact pads 116 (or drain manifold 120), and elongated drain electrode structures 110 (e.g., runners) extend from one or more drain contact pads 116 (and drain manifold 120) toward (but not to) one or more gate contact pads 114 (or gate manifold 118). Gate structures coupled to the gate electrode structures 108 may overlie the channel regions (e.g., in active regions 96) of transistor 92 and gate electrode structures 108 may be electrically interconnected by the gate manifold structure 118 underlying or adjacent to the gate contact pads 114. Further, gate electrode structures 108 are electrically connected to channel subregions 102 (see especially FIG. 4) within active regions 96 of transistor 92. Drain electrode structures 110 may generally extend along the sides of the channel regions of transistor 92 and drain electrode structures 110 may be electrically interconnected by the drain manifold structure 120 underlying or adjacent to drain contact pads 116. Further, drain electrode structures 110 are electrically connected to drain subregions 104 (see especially FIG. 4) within active regions 96 of transistor 92.

In some embodiments, gate and drain contact pads 114, 116 are positioned at locations outside the outer periphery of active area 94 of transistor 92. More specifically, gate and drain electrode structures 108, 110 extend substantially parallel to one another along a first axis of semiconductor device 70, which extends substantially parallel to frontside 74 and corresponds to the Y-axis of a coordinate legend 122 appearing in the upper right corner of FIG. 5. Gate contact pads 114 are located adjacent to a first side 124 of active area 94 (or between the active area 92 and a first side 125 of device 70) and drain contact pads 116 are located adjacent to a second side 126 of active area 92 (or between the active area 92 and a second, opposite side 127 of device 70), where first and second sides 124, 126 of the active area 94 are opposite one another and first and second sides 124, 126 are oriented along a second axis of semiconductor device 70, which extends substantially parallel to frontside 74 and is perpendicular to the first axis, which corresponds to the X-axis of coordinate legend 122. Similarly, first and second sides 125, 127 of the device 70 are opposite one another and first and second sides 125, 127 also are oriented along the second axis of semiconductor device 70, which extends substantially parallel to frontside 74 and is perpendicular to the first axis, which corresponds to the X-axis of coordinate legend 122.

Elongated source electrode structures 112 within interconnect structure 80 overlie inactive regions 100 within transistor area 94 of transistor 92. Source contact pads 128 (illustrated by "S" in FIG. 5), of the generally referenced contact pads 88, are electrically connected to source electrode structures 112, and as discussed previously, source electrode structures 112 are electrically coupled to source subregions 106. Like gate and drain contact pads 114, 116, source contact pads 128 are also contained in frontside I/O interface 86 formed in the outer portion of interconnect structure 80 of semiconductor device 70. However, source contact pads 128 are positioned at locations overlying active area 94 of transistor 92, and more specifically, overlying inactive regions 100 of active area 94 of transistor 92. Thus, source contact pads 128 are positioned between gate electrode structures 108 of adjacent active regions 96, and are further positioned between gate and drain contact pads 114, 116. The location of source contact pads 128 and the presence of conductive connection elements 90 (e.g., pillars, solder bumps, and so forth) over source contact pads 128 can provide a low impedance path to ground. Further, the arrangement of source contact pads 128 relative to gate and drain contact pads 114, 116 can provide effective isolation between gate and drain contact pads 114, 116. In accordance with an embodiment, transistor 92 of semiconductor device 70 lacks conventional through substrate vias (TSVs) extending through die body 72 to provide connection between the source regions 106 and the backside 76 of the device 70. Instead, suitably configured routing features of source electrode structures 112 within interconnect structure 80 electrically interconnect source subregions 106 to source contact pads 128 at frontside I/O interface 86. Accordingly, electrical connections to the gate structures (through gate bond pads 114, gate manifold 118, and gate electrode structures 108), electrical connections to the drain regions (through drain bond pads 116, drain manifold 120, and drain electrode structures 110), and electrical connections to the source regions (through source bond pads 128 and source electrode structures 112) are made at the upper surface 48 of the device 70 (i.e., through gate, drain, and source bond pads 114, 116, 128).

Figure 6:
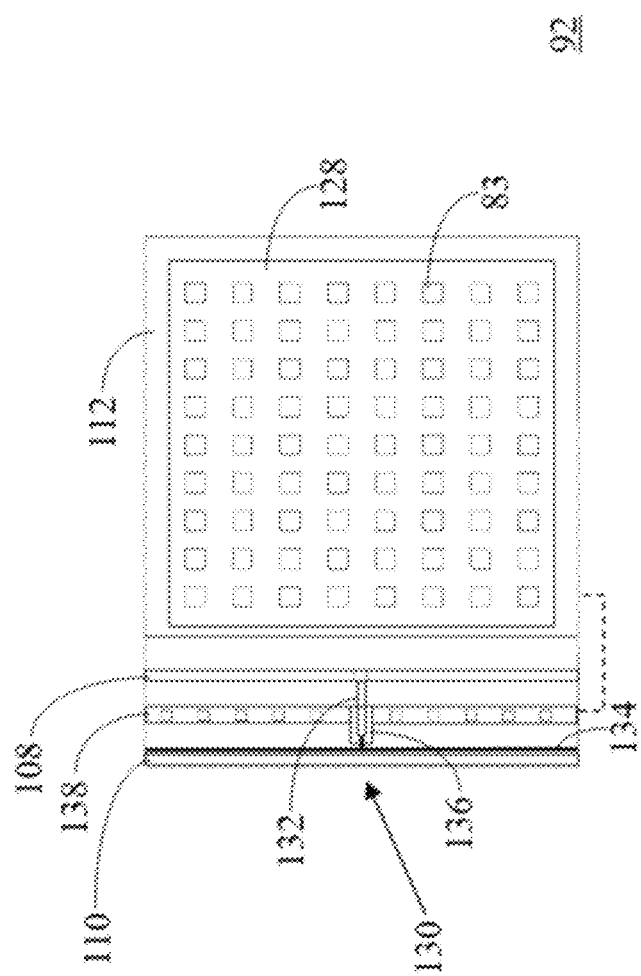
FIG. 6 shows plan view of an enlarged portion of the semiconductor device delineated in FIG. 5 by a dashed line box.

FIG. 6 shows plan view of an enlarged portion of transistor 92 delineated in FIG. 5 by a dotted line box near the center of active area 94. In this enlarged view, a portion of drain electrode structure 110 (e.g., runner), a portion of gate electrode structure 108 (e.g., runner), and a portion of source electrode 112 are visible at a tap location 130 of transistor 92. Transistor 92 may include a plurality of tap interconnects 132 (one shown) formed from electrically conductive material, typically metal. Tap interconnects 132 are electrically connected between gate electrode structures 108 and gate taps 134 to channel subregions 102 (FIG. 4) formed within die body 72. Thus, tap interconnects 132 form a portion of an input to channel subregions 102, and tap locations 130 are the positions where tap interconnects 132 approach drain electrode structure 110 (typically a pillar forming a portion of an output from drain subregion 104, see FIG. 4).

The potential for undesirable feedback capacitance imposed upon the output metallization (e.g. drain electrode structure 110) is greatest at the input metallization (e.g., tap interconnects 132). That is, the input signal tapped from gate electrode structure 108 can add parasitic feedback capacitance to an output signal from drain electrode structure 110. Accordingly, transistor 92 may include shield structures 136 (one shown) formed in interconnect structure 80 and interposed between tap interconnects 132 of gate electrode structures 108 and drain electrode structures 110 at tap locations 130. Such shield structures 136 are electrically isolated from the gate and drain electrode structures 108, 110, but are configured to largely block an electric field between tap interconnects 132 and the pillar of drain electrode structure 110. Shield traces 138 (one shown) of shield structures 136 may be strategically longitudinally aligned with gate electrode structure 108. Shield traces 138 in interconnect structure 80 may be suitably configured with patterned conductive material 81 (FIG. 3) and vertical connections 83 (FIG. 3) to electrically interconnect shield structures 136 with source electrode structures 112 so as to provide a path to ground. This electrical interconnection between shield trace 138 and source electrode structure 112 is represented by a dashed line for simplicity of illustration.

The enlarged view of FIG. 6 additionally shows one of source contact pads 128 and vertical connections 83 coupling source contact pad 128 to the underlying source electrode structure 112. Although a multiplicity of vertical connections 83 are shown underlying source contact pad 128, vertical connections 83 may be arranged differently in alternative embodiments. For example, a row of vertical connections 83 may be formed in interconnect structure 80 adjacent to and electrically interconnected with source contact pad 128.

Figure 7:
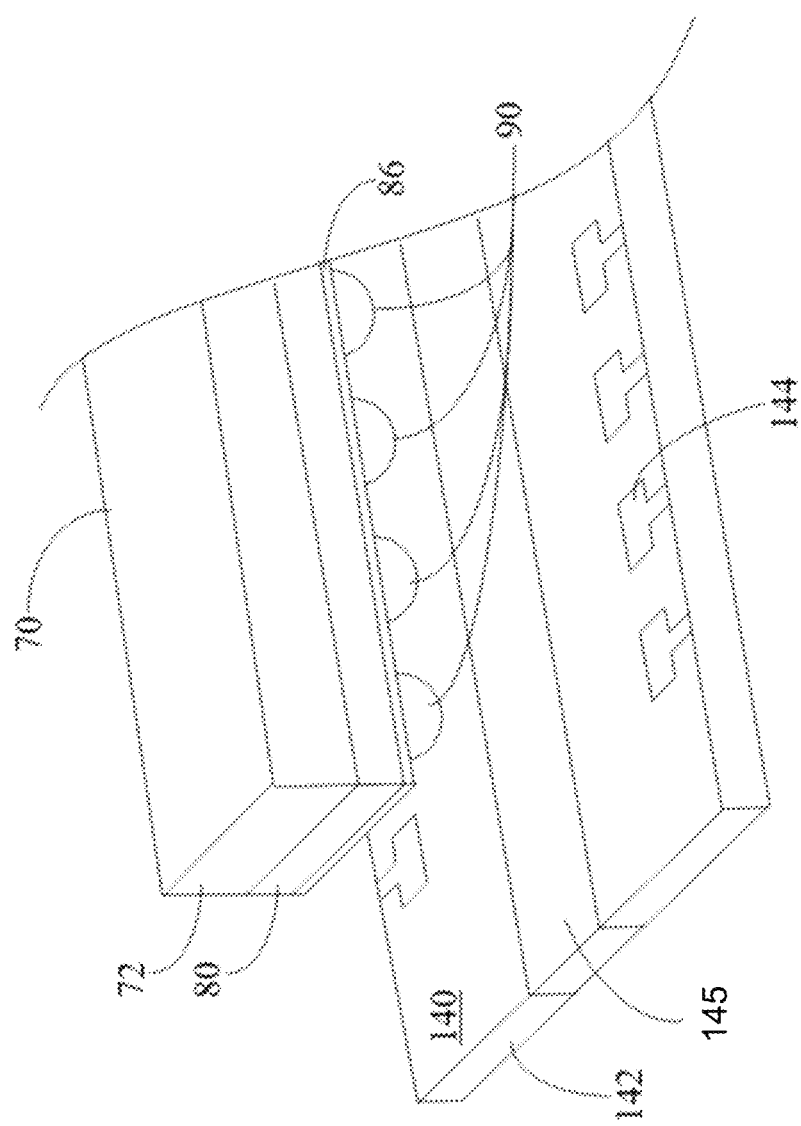
FIG. 7 shows a partial isometric view of the semiconductor device of FIGS. 4-6 of a larger electronic assembly (partially shown) in which the semiconductor device may be incorporated.

FIG. 7 shows a partial isometric view of the semiconductor device 70 of FIGS. 4-6 of a larger electronic assembly (partially shown) in which semiconductor device 70 may be incorporated. Due to its flip-chip topology in which all of the gate, drain, and source contact pads (e.g., pads 114, 116, 128, FIG. 5) are exposed at the same surface of device 70, semiconductor device 70 may be well-suited for installation within a power amplifier in an inverted orientation, such that frontside I/O interface 86 faces toward a die support surface 140 of a secondary structure 142 (e.g., a power amplifier substrate) to which at least one semiconductor device 70 is mounted, potentially along with any number of additional microelectronic components.

Semiconductor device 70 can be mounted to secondary structure 142 in an inverted orientation such that frontside I/O interface 86 may be physically and electrically interconnected with corresponding contact pads or electrical routing features at die support surface 140 of the secondary structure 142 without the usage of wirebonds. Specifically, contact pads 88 (FIG. 4, which include gate, drain, and source contact pads 114, 116, 128 shown in FIG. 5) included in frontside I/O interface 86 may be electrically and mechanically interconnected with corresponding routing features 144 or ground features 145 of secondary structure 142 utilizing conductive connection elements 90 (e.g., solder balls, electrically-conductive pillars, and so forth). More specifically, the gate and drain contact pads 114, 116 may be coupled to routing features 144, and the source contact pads 128 may be coupled to one or more ground features 145.

Implementing flip-chip dies for at least some of the dies in an amplifier module may have various advantages. For example, manufacturing efficiency may be improved by eliminating at least some of the wirebond connections in the module, as making such connections is a relatively expensive and time-consuming process. Further, signals carried through wirebonds produce significant electromagnetic radiation, which may couple to nearby components and cause signal interference. In contrast, implementing flip-chip-die may reduce wirebond-associated parasitic losses otherwise occurring during high frequency operation of a resulting power transistor die (or dies) contained in a power amplifier due to the presence of lengthy wire bonds. Further, wirebonds also are relatively lossy components. Accordingly, by eliminating at least some of the wirebonds in an amplifier module design, RF performance (e.g., gain, noise, etc.) may be improved.

In addition, more compact module designs may be achieved, because bond pads tend to consume a significant amount of die space, and power transistor dies that lack bond pads for wirebond connections may be designed to be relatively small. The modules themselves also may be designed more compactly, because the elimination of wirebonds and their associated electromagnetic coupling means that other module components (e.g., surface mount components) may be placed closer to flip-chip dies than to non-flip-chip dies, while still achieving adequate performance.

Figure 8:
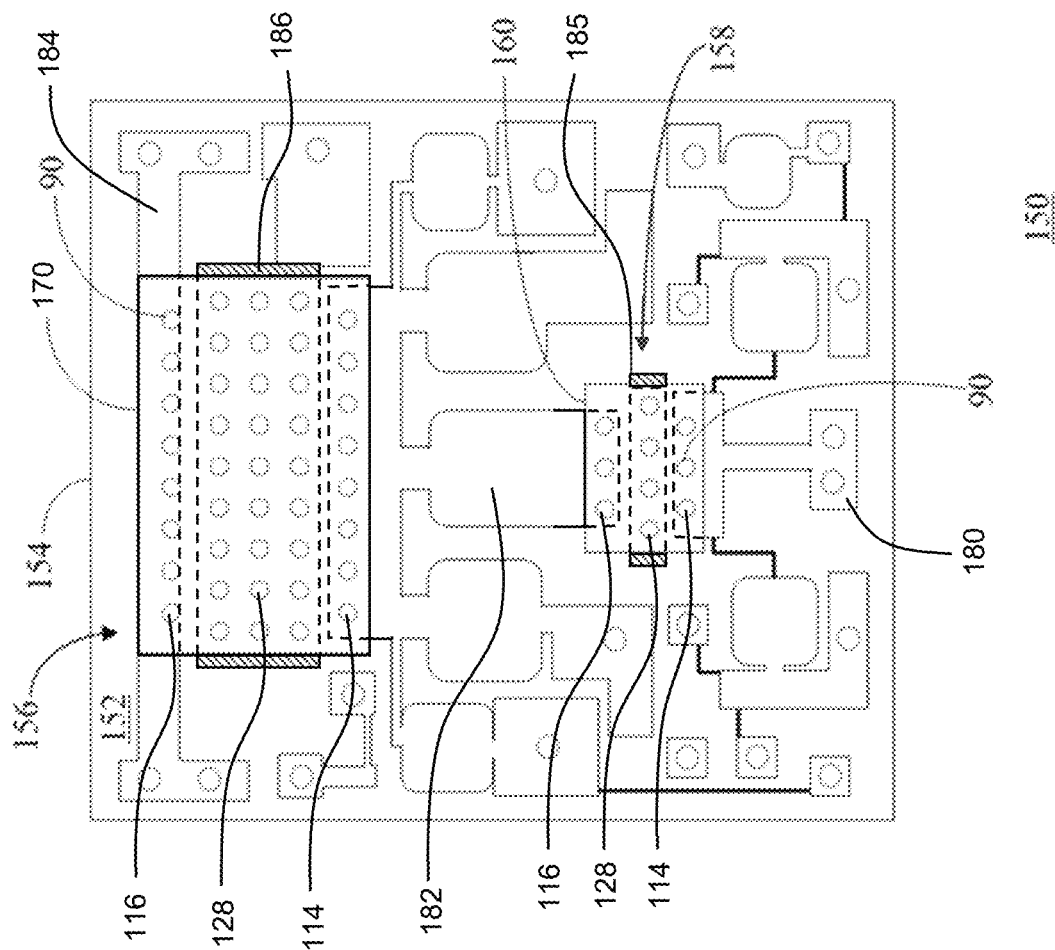
FIG. 8 shows a plan view of a power amplifier integrated circuit containing at least one semiconductor device having the flip-chip topology in accordance with another embodiment.

FIG. 8 shows a plan view of a power amplifier module 150 containing two semiconductor devices having a flip-chip topology in accordance with another embodiment. The term "power amplifier module," as appearing herein, refers to a modular electronic assembly containing at least one RF power transistor die utilized for power or signal amplification purposes. As such, semiconductor device 70 (FIG. 5) may be an RF power transistor die, and two instantiations of semiconductor device 70 are included in the power amplifier module 150 of FIG. 8 as RF power transistor dies 160 and 170. According to an embodiment, neither of the RF power transistor dies 160, 170 include TSVs (e.g., source vias 40, FIG. 3). More specifically, power amplifier module 150 includes two RF power transistor dies 160, 170, which are attached to a die support surface 152 of a module substrate 154, such as a printed circuit board (PCB) or ceramic substrate.

In the illustrated example, power amplifier module 150 is a dual stage power amplifier having a primary, driver, or "first" transistor stage 158 (including power transistor die 160) coupled in series with a secondary, final, or "second" transistor stage 156 (including power transistor die 170). Each of power transistor dies 160, 170 may have "flip-chip" configurations or topologies similar or substantially identical to die 70 (FIG. 5), although dies 160, 170 may have relatively different sizes and/or different numbers of transistor fingers and/or contacts from each other and/or from die 70. In addition, it should be understood that dies 160, 170 each may include a single transistor stage or multiple transistor stages coupled in parallel or series. In the illustrated embodiment, both of the dies 160, 170 are mounted to the die support surface 152 of the power amplifier module substrate 154 in a "flip-chip" orientation in which the contact pads (e.g., gate, drain, and source contact pads 114, 116, 128) all face and directly connect (through conductive connection elements 90) to conductive features (e.g., conductive traces or other features) on or at the die support surface 152 of the module substrate 154.

In addition, the power amplifier module 150 includes a conductive signal input trace 180 at the surface 152 of the module substrate 154 that is electrically coupled to the input (e.g., gate contact pad(s) 114, FIG. 5) of the power transistor die 160 of the first transistor stage 158. The output (e.g., drain contact pad(s) 116, FIG. 5) of power transistor die 160 is electrically coupled to the input (e.g., gate contact pad(s) 114, FIG. 5) of power transistor die 170 through at least one additional conductive signal trace 182 (and possibly interstage impedance matching circuitry). Further, the output (e.g., drain contact pad(s) 116, FIG. 5) of the power transistor die 170 is electrically coupled to a conductive signal output trace 182 at the surface 152 of the module substrate 154. Finally, the source contacts (e.g., source contact pads 128, FIG. 5) of both power transistor dies 160, 170 are electrically coupled to ground features 185, 186 (e.g., conductive coins, traces, vias, or other structures) of the module substrate 154. The power amplifier module 150 also may include various other electronic components (only a few of which are shown for clarity), such as shunt capacitors and bias circuitry.

Again, power transistor die 160 of pre-amplifier transistor stage 158 and power transistor die 170 of secondary amplifier transistor stage 156 may have the flip-chip topology described in detail above in connection with semiconductor device 70 (FIGS. 4-7). Electrically conductive connection elements 90 (e.g., solder balls, or pillars, and shown in dotted line form as they are located on the hidden lower surface of the dies 160, 170) may be deposited over the contact pads of power transistor dies 160, 170 (e.g., gate, drain, and source contact pads 114, 116, 128, FIG. 5) as discussed previously so that power transistor dies 160, 170 can be inverted and mounted (physically joined and electrically interconnected) to die support surface 152 of module substrate 154 such that the frontside I/O interface of power transistor dies 160, 170 face die support surface 152 of module substrate 154. Similarly, the various other electronic components may be mounted to die support surface 152 to form power amplifier 150, which ultimately may be installed in a larger electronic system or assembly.

Accordingly, methodology for implementing a power amplifier includes providing one or more power transistor dies that includes a die body having a frontside, a transistor having an active area formed in the die body, the active area being bounded by an outer periphery, an interconnect structure formed over the frontside of the die body, the interconnect structure containing patterned electrically conductive material defining gate, drain, and source contacts electrically coupled to channel, drain, and source subregions, respectively, within the active area of the transistor, and a frontside input/output (I/O) interface formed in an outer portion of the interconnect structure, the frontside I/O interface containing gate, drain, and source contact pads, the gate contact pad being electrically connected to the gate structure, the drain contact pad being electrically connected to the drain contact, and the source contact pad being electrically connected the source contact, wherein the source contact pad is positioned at a location overlying the active area of the transistor. The methodology further includes forming electrically conductive connection elements on each of the gate, drain, and source contact pads and utilizing the conductive connection elements to couple the power transistor die to a module substrate in an inverted orientation with the gate, drain, and source contact pads facing a die support surface of the module substrate. In some embodiments, the utilizing operation further includes connecting the electrically conductive connection elements on each of the source contact pads to a ground element of the module substrate and providing a path to ground between shield structures of the power transistor die and the ground element of the module substrate.

Thus, in the embodiment of FIG. 8, the use of wirebonds is avoided which may minimize parasitic losses during operation of power amplifier 150 to improve operational efficiency, particularly when the RF power transistor dies 160, 170 are operated at higher frequencies approaching or exceeding 3 Gigahertz. Further, following inverting and mounting, a thermal extension (not shown), such as a copper flange, may be attached the exposed backside 76 (FIG. 4) of power transistor dies 160, 170 for facilitating heat removal for those power transistor dies that are particularly susceptible to excess heat generation and accumulation. While described below as integrated into a particular type of power amplifier IC, it is emphasized that embodiments of power transistor die 70 having the described flip-chip topology can be integrated into various different types of modules (including microelectronic packages), including push-pull-type amplifier modules.

Accordingly, embodiments disclosed herein entail semiconductor devices, and more specifically a transistor device having a flip-chip topology. The layout of the transistor device enables interconnection of transistor input, output, and source terminals through a frontside input/output (I/O) interface. Electrical interconnections between contact pads contained in the die's frontside I/O interface and the corresponding electrical routing features of the module substrate may be formed utilizing electrically conductive connection elements, such as solder balls or electrically-conductive pillars, to avoid the usage of wirebonds. The layout of the transistor device enables the effective utilization of gaps between transistor fingers to create contact pads for source regions, thereby resulting in a compact transistor. Further, the topology enables vertical flow of source currents through patterned electrically conductive material and electrically conductive vertical connections extending from the frontside of the die body through an interconnect structure to provide a low impedance path to ground. Still further, the semiconductor devices are produced to lack TSVs to lower manufacturing costs and complexity, and provide increased structural robustness. Additionally, the arrangement of the typically grounded source contacts between input and output contact pads may provide effective isolation between the input and outputs. Such flip-chip semiconductor devices may be well-suited for incorporation into a power amplifier, e.g., a modular electronic assembly, containing at least one radio frequency (RF) power transistor die utilized for power or signal amplification purposes. When so incorporated, a given flip-chip semiconductor device may be mounted to a module substrate, such as a printed circuit board (PCB) or a ceramic substrate, in an inverted orientation such that the frontside I/O interface of the semiconductor device faces the die support surface of the module substrate.

The power amplifier module 150 of FIG. 8 is a two-stage power amplifier in which both the first stage 158 and the second stage 156 include power transistor dies 160, 170 with flip-chip topologies. In other embodiments of power amplifier modules, a combination of flip-chip and non-flip-chip power transistor dies may be desirable.

Figure 9:
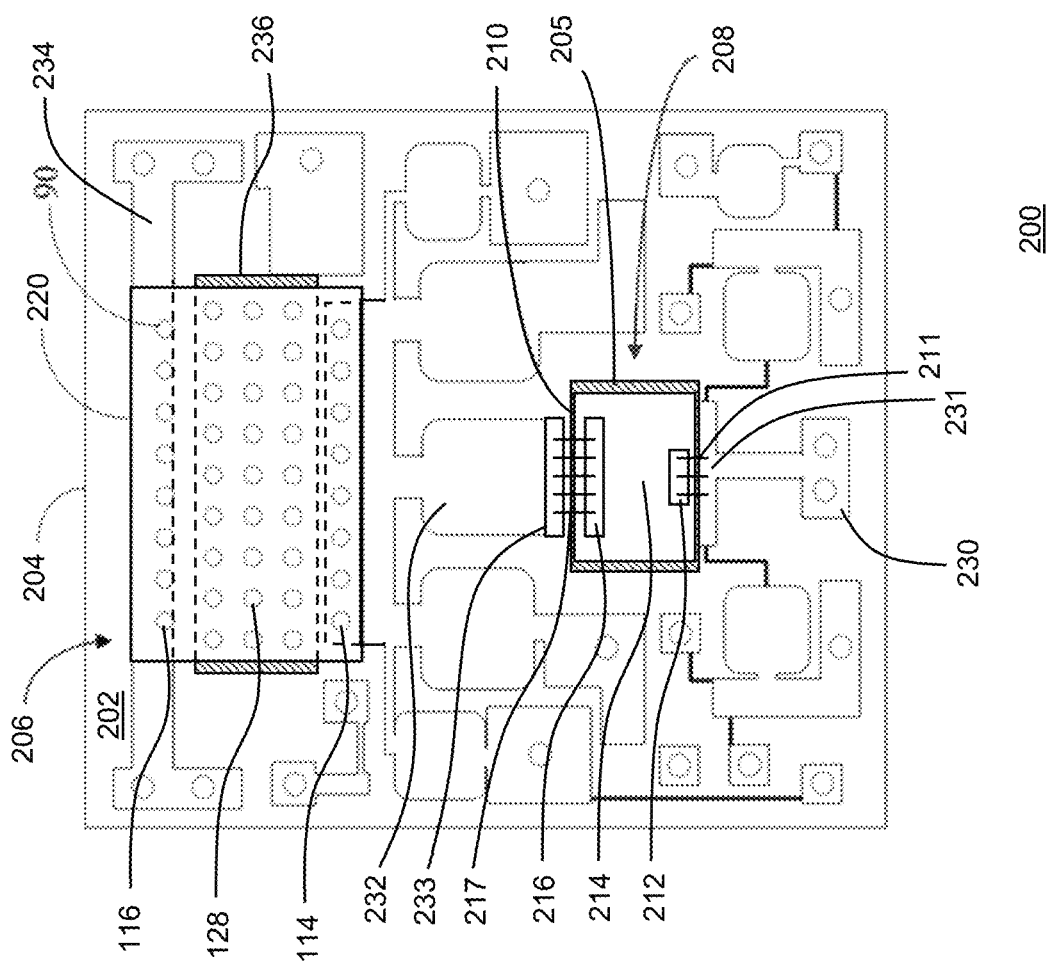
FIG. 9 shows a plan view of a power amplifier integrated circuit containing at least one semiconductor device having the flip-chip topology and at least one other semiconductor device having a non-flip-chip topology in accordance with another embodiment.

For example, FIG. 9 shows a plan view of a power amplifier module 200 containing a first semiconductor device 210 having a non-flip-chip topology, and a second semiconductor device 220 having the flip-chip topology in accordance with another embodiment. According to an embodiment, the second semiconductor device 220 does not include TSVs (e.g., source vias 40, FIG. 3). More specifically, power amplifier 200 includes two RF power transistor dies 210, 220, which are attached to a die support surface 202 of a module substrate 204, such as a PCB or ceramic substrate. The RF power transistor dies 210, 220 form portions of an amplifier path, and are coupled in series between an input (e.g., trace 230) of the amplifier path and an output (e.g., trace 234) of the amplifier path. Power transistor die 210 has a non-flip-chip configuration or topology (i.e., a topology similar or substantially identical to die 30, FIG. 2), and power transistor die 220 has a flip-chip configuration or topology (i.e., a topology similar or substantially identical to die 70, FIG. 5). It should be understood that dies 210, 220 may have relatively different sizes and/or different numbers of transistor fingers and/or contacts than dies 30, 70, and additionally the dies 210, 220 each may include a single transistor stage or multiple transistor stages integrated within each die 210, 220 and coupled in parallel or series. In the illustrated example, power amplifier module 200 is a dual stage power amplifier having a primary, pre-amplifier, or "first" transistor stage 208 (including power transistor die 210) coupled in series with a secondary, final, or "second" transistor stage 206 (including power transistor die 220). The power amplifier module 200 also may include various other electronic components (only a few of which are shown for clarity), such as shunt capacitors and bias circuitry.

Power transistor die 210 may be similar to semiconductor device 30 (FIGS. 2, 3), in that power transistor die 210 includes an active area 214 with one or more transistors (and/or transistor fingers) coupled in series or parallel between input and output (or gate and drain) contact pads 212, 216 (e.g., gate and drain contact pads 44, 46, FIGS. 2, 3) that are positioned at or on an upper surface (e.g., surface 48, FIGS. 2, 3) of the die 210. In addition, power transistor die 210 includes source vias (e.g., source vias 40, FIGS. 2, 3) that provide a portion of an electrically conductive path between the transistor source semiconductor regions and the lower surface (e.g., surface 36, FIG. 3) of the die 210, which may be considered a source contact pad. These source vias may contact a conductive layer (e.g., conductive layer 58, FIG. 3) on the lower surface of the die 210.

In the illustrated embodiment, die 210 is mounted to the die support surface 202 of the power amplifier module substrate 204 in a "non-flip-chip" orientation in which the gate contact pad 212 and drain contact pad 216, respectively) are exposed at the surface of the die 210 that faces away from the die support surface 202. In other words, the frontside I/O interface of power transistor 210 faces away from the die support surface 202 of module substrate 204. According to an embodiment, the above-mentioned conductive layer (e.g., conductive layer 58, FIG. 3) on the opposite surface of the die 210 faces toward the die support surface 202 and is directly coupled (e.g., using solder, sintered metal, conductive epoxy, or other electrically-conductive material) to a conductive ground feature 205 of the module substrate 204 (e.g., similar to ground feature 68, FIG. 3). For example, the conductive ground feature 205 may include a conductive coin embedded within the module substrate 204, or alternatively may include conductive pads, traces, and/or vias, in other embodiments.

In contrast, die 220 is mounted to the die support surface 202 of the power amplifier module substrate 204 in a "flip-chip" orientation in which the contacts (e.g., gate, drain, and source contact pads 114, 116, 128) all face toward and directly connect (through conductive connection elements 90) to conductive features (e.g., conductive traces or other features) on the die support surface 202 of the module substrate 204. In other words, die 220 may have the flip-chip topology described in detail above in connection with semiconductor device 70 (FIGS. 4-7). Electrically conductive connection elements 90 (e.g., solder balls, or pillars, and shown in dotted line form) may be deposited over the contact pads of power transistor die 220 (e.g., gate, drain, and source contact pads 114, 116, 128, FIG. 5) as discussed previously so that power transistor die 220 can be inverted and mounted (physically joined and electrically interconnected) to die support surface 202 of module substrate 204 such that the frontside I/O interface of power transistor die 220 faces toward the die support surface 202 of module substrate 204.

The gate and drain contact pads 114, 116 are electrically coupled to traces at the surface 202 of the module substrate 204, as will be described below. The source contact pads 128 (e.g., source contact pads 128, FIG. 5) of power transistor die 220 are electrically coupled to one or more ground features 236 (e.g., conductive coins, traces, vias, or other structures) of the module substrate 204.

Similar to the embodiment of FIG. 8, the power amplifier module 200 includes a conductive signal input trace 230 at the surface 202 of the module substrate 204. The input trace 230 is electrically coupled through a bond pad 231 on the die support surface 202 (e.g., similar to bond pad 62, FIG. 3) and through wirebonds 211 (e.g., similar to wirebonds 60, FIG. 3) to the gate contact pad 212 at the outer-facing, upper surface of power transistor die 210. The drain contact pad 216 at the outer-facing, upper surface of the power transistor die 210 is electrically coupled through additional wirebonds 217 (e.g., similar to wirebonds 60, FIG. 3) to another bond pad 233 (e.g., similar to bond pad 64, FIG. 3) on the die support surface 202. Bond pad 233 is coupled through at least one additional conductive signal trace 232 (and possibly interstage impedance matching circuitry) to the input (e.g., gate contact pad(s) 114, FIG. 5) of the second power transistor die 220. Further, the output (e.g., drain contact pad(s) 116, FIG. 5) of the second power transistor die 220 is electrically coupled to a conductive signal output trace 234 at the surface 202 of the module substrate 204.

In the embodiment of FIG. 9, the power amplifier module 200 includes a first amplifier stage 208 with a power transistor die 210 that is coupled to a module substrate 204 in a non-flip-chip orientation, and a second amplifier stage 206 with a power transistor die 220 that is coupled to the module substrate 204 in a flip-chip orientation. In another alternate embodiment, the orientations of the first and second power transistor dies may be reversed.

Figure 10:
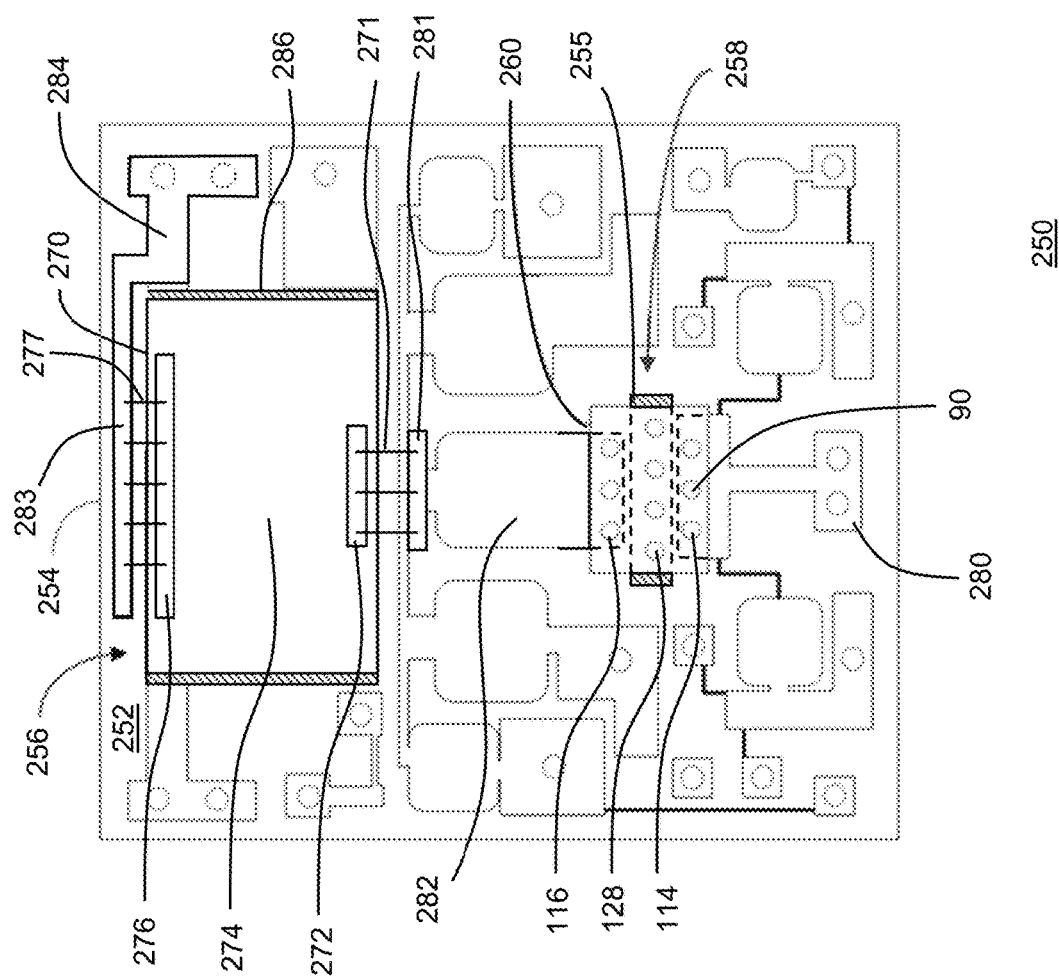
FIG. 10 shows a plan view of a power amplifier integrated circuit containing at least one semiconductor device having the flip-chip topology and at least one other semiconductor device having a non-flip-chip topology in accordance with yet another embodiment.

For example, FIG. 10 shows a plan view of a power amplifier module 250 containing a first semiconductor device 260 having the flip-chip topology, and a second semiconductor device 270 having a non-flip-chip topology in accordance with another embodiment. According to an embodiment, the first semiconductor device 260 does not include TSVs (e.g., source vias 40, FIG. 3). More specifically, power amplifier 250 includes two RF power transistor dies 260, 270, which are attached to a die support surface 252 of a module substrate 254, such as a PCB or ceramic substrate. The RF power transistor dies 260, 270 form portions of an amplifier path, and are coupled in series between an input (e.g., trace 280) of the amplifier path and an output (e.g., trace 284) of the amplifier path. Power transistor die 260 has a flip-chip configuration or topology (i.e., a topology similar or substantially identical to die 70, FIG. 5), and power transistor die 270 has a non-flip-chip configuration or topology (i.e., a topology similar or substantially identical to die 30, FIG. 2). It should be understood that dies 260, 270 may have relatively different sizes and/or different numbers of transistor fingers and/or contacts than dies 70, 30, and additionally the dies 260, 270 each may include a single transistor stage or multiple transistor stages coupled in parallel or series. In the illustrated example, power amplifier module 250 is a dual stage power amplifier having a primary, pre-amplifier, or "first" transistor stage 258 (including power transistor die 260) coupled in series with a secondary, final, or "second" transistor stage 256 (including power transistor die 270). The power amplifier module 250 also may include various other electronic components (only a few of which are shown for clarity), such as shunt capacitors and bias circuitry.

Power transistor die 260 is mounted to the die support surface 252 of the power amplifier module substrate 254 in a "flip-chip" orientation in which the contacts (e.g., gate, drain, and source contact pads 114, 116, 128) all face toward and directly connect (through conductive connection elements 90) to conductive features (e.g., conductive traces or other features) on the die support surface 252 of the module substrate 254. In other words, die 260 may have the flip-chip topology described in detail above in connection with semiconductor device 70 (FIGS. 4-7). Electrically conductive connection elements 90 (e.g., solder balls, or pillars, and shown in dotted line form) may be deposited over the contact pads of power transistor die 260 (e.g., gate, drain, and source contact pads 114, 116, 128, FIG. 5) as discussed previously so that power transistor die 260 can be inverted and mounted (physically joined and electrically interconnected) to die support surface 252 of module substrate 254 such that the frontside I/O interface of power transistor die 260 faces toward the die support surface 252 of module substrate 254.

The gate and drain contact pads 114, 116 are electrically coupled to traces at the surface 202 of the module substrate 204, as will be described below. The source contact pad(s) 128 (e.g., source contact pads 128, FIG. 5) of power transistor die 260 are electrically coupled to one or more ground features 255 (e.g., conductive coins, traces, vias, or other structures) of the module substrate 254.

In contrast, power transistor die 270 may be similar to semiconductor device 30 (FIGS. 2, 3), in that power transistor die 210 includes an active area 274 with one or more transistors (and/or transistor fingers) coupled in series or parallel between input and output (or gate and drain) contact pads 272, 276 (e.g., gate and drain contact pads 44, 46, FIGS. 2, 3) that are positioned at or on an upper surface (e.g., surface 48, FIGS. 2, 3) of the die 270. In addition, power transistor die 270 includes source vias (e.g., source vias 40, FIGS. 2, 3) that provide a portion of an electrically conductive path between the transistor source semiconductor regions and the lower surface (e.g., surface 36, FIG. 3) of the die 270. These source vias may contact a conductive layer (e.g., conductive layer 58, FIG. 3) on the lower surface of the die 270, which may be considered a source contact pad.

In the illustrated embodiment, die 270 is mounted to the die support surface 252 of the power amplifier module substrate 254 in a "non-flip-chip" orientation in which the gate bond pad 272 and drain bond pad 276, respectively) are exposed at the surface of the die 270 that faces away from the die support surface 252. In other words, the frontside I/O interface of power transistor 270 faces away from the die support surface 252 of module substrate 254. According to an embodiment, the above-mentioned conductive layer (e.g., conductive layer 58, FIG. 3) on the opposite surface of the die 270 faces toward the die support surface 252 and is directly coupled (e.g., using solder, sintered metal, conductive epoxy, or other electrically-conductive material) to a conductive ground feature 286 of the module substrate 254 (e.g., similar to ground feature 68, FIG. 3). For example, the conductive ground feature 286 may include a conductive coin embedded within the module substrate 254, or alternatively may include conductive pads, traces, and/or vias, in other embodiments.

Similar to the embodiment of FIGS. 8 and 9, the power amplifier module 250 includes a conductive signal input trace 280 at the surface 252 of the module substrate 254. The input trace 280 is electrically coupled to the input (e.g., gate contact pad(s) 114, FIG. 5) of the first power transistor die 260. The output (e.g., drain contact pad(s) 116, FIG. 5) of the first power transistor die 260 is electrically coupled through at least one additional conductive signal trace 282 (and possibly interstage impedance matching circuitry) to a bond pad 281 on the die support surface 252 (e.g., similar to bond pad 62, FIG. 3). Bond pad 281 is coupled through wirebonds 271 (e.g., similar to wirebonds 60, FIG. 3) to the gate contact pad 272 at the outward-facing, upper surface of power transistor die 270. The drain contact pad 276 at the outward-facing, upper surface of the power transistor die 270 is electrically coupled through additional wirebonds 277 (e.g., similar to wirebonds 60, FIG. 3) to another bond pad 283 (e.g., similar to bond pad 64, FIG. 3) on the die support surface 252. Bond pad 283, in turn, is coupled to a conductive signal output trace 284 at the surface 252 of the module substrate 254.

The module embodiments described in conjunction with FIGS. 8-10 each support a multiple-stage, single-path amplifier. In some other configurations, as described below in conjunction with FIGS. 11-15, the flip-chip and non-flip-chip power transistor dies may be utilized in a multiple-path amplifier, such as a Doherty power amplifier, which includes a carrier amplifier path and at least one peaking amplifier path electrically connected in parallel and attached to a die support surface of a module substrate. The peaking amplifier die(s) and the carrier amplifier die(s) each may embody a single stage amplifier or a multiple-stage amplifier.

Figure 11:
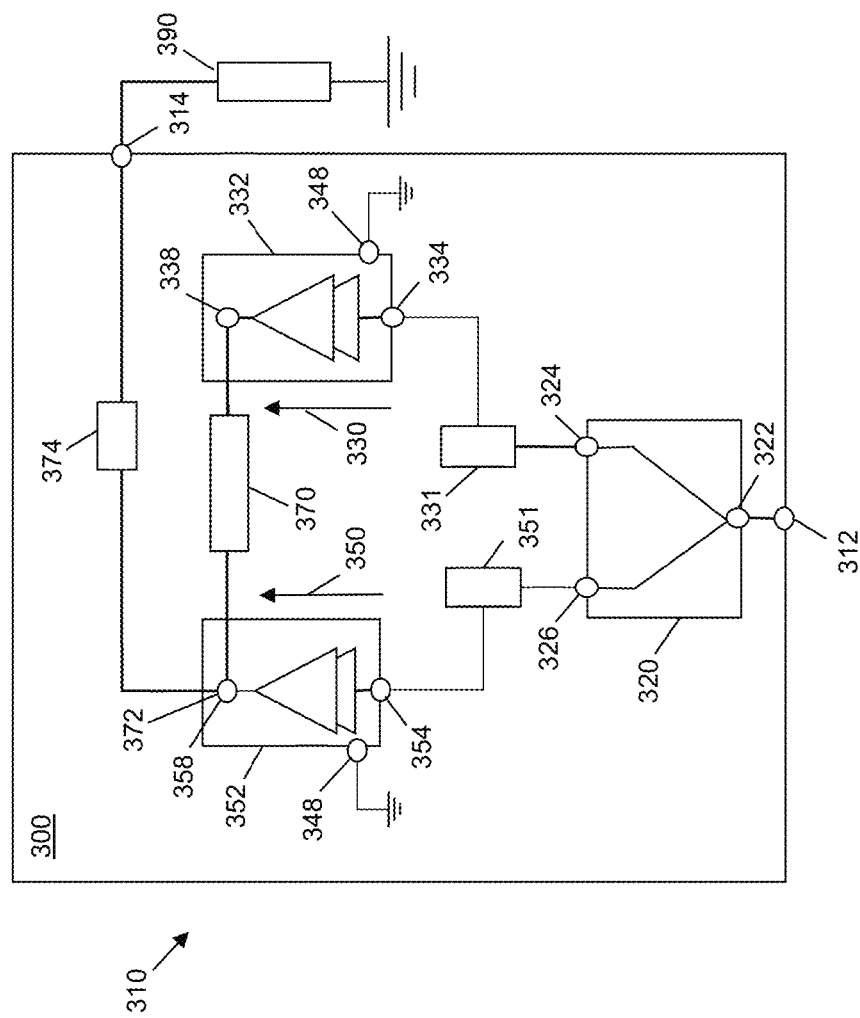
FIG. 11 shows a schematic of a Doherty power amplifier in accordance with an embodiment.

FIG. 11 shows a schematic of a Doherty power amplifier 310 implemented in a power amplifier module 300, in accordance with an embodiment. Power amplifier module 300 essentially includes a Doherty amplifier 310 implemented on a module substrate (e.g., module substrate 410, FIG. 12). Doherty amplifier 310 includes an RF input terminal 312, an RF output terminal 314, a power splitter 320, a carrier amplifier path 330 with one or more carrier amplifier dies (e.g., dies 433, 434, 633, FIGS. 12, 14), a peaking amplifier path 350 with one or more peaking amplifier dies (e.g., dies 453, 454, 653 FIGS. 12, 14), a phase delay and impedance inversion element 370, and a combining node 372, in an embodiment.

When incorporated into a larger RF system, the RF input terminal 312 is coupled to an RF signal source, and the RF output terminal 314 is coupled to a load 390 (e.g., an antenna or other load). The RF signal source provides an input RF signal, which is an analog signal that includes spectral energy that typically is centered around one or more carrier frequencies. Fundamentally, the Doherty amplifier 310 is configured to amplify the input RF signal, and to produce an amplified RF signal at the RF output terminal 314.

The power splitter 320 has an input 322 and two outputs 324, 326, in an embodiment. The power splitter input 322 is coupled to the RF input terminal 312 to receive the input RF signal. The power splitter 320 is configured to divide the RF input signal received at input 322 into first and second RF signals (or carrier and peaking signals), which are provided to the carrier and peaking amplifier paths 330, 350 through outputs 324, 326, respectively. According to an embodiment, the power splitter 320 is configured to impart a first phase shift (e.g., about a 90 degree phase shift) to the peaking signal before it is provided to output 326. Alternatively, as will be explained below, the power splitter 320 may be configured to impart a first phase shift (e.g., about a 90 degree phase shift) to the carrier signal before it is provided to output 324. Either way, at outputs 324 and 326, the carrier and peaking signals may be about 90 degrees out of phase from each other.

When Doherty amplifier 310 has a symmetrical configuration (i.e., a configuration in which the carrier and peaking amplifier power transistors are substantially identical in size), the power splitter 320 may divide or split the input RF signal received at the input 322 into two signals that are very similar with, in some embodiments, equal power. Conversely, when Doherty amplifier 310 has an asymmetrical configuration (i.e., a configuration in which one of the amplifier power transistors, typically the peaking amplifier transistor, is significantly larger), the power splitter 320 may output carrier and peaking signals having unequal power.

The outputs 324, 326 of the power splitter 320 are connected to the carrier and peaking amplifier paths 330, 350, respectively. The carrier amplifier path 330 is configured to amplify the carrier signal from the power splitter 320, and to provide the amplified carrier signal to the power combining node 372. Similarly, the peaking amplifier path 350 is configured to amplify the peaking signal from the power splitter 320, and to provide the amplified peaking signal to the power combining node 372, where the paths 330, 350 are designed so that the amplified carrier and peaking signals arrive in phase with each other at the power combining node 372.

According to an embodiment, the carrier amplifier path 330 includes an input circuit 331 (e.g., including an impedance matching circuit), a carrier amplifier 332 implemented using one or more carrier amplifier dies (e.g., dies 433, 434, FIG. 12), and a phase shift and impedance inversion element 370.

The carrier amplifier 332 includes an RF input contact 334 (or one or more input contact pads), an RF output contact 338 (or one or more output contact pads) and one or more amplification stages coupled between the input and output terminals 334, 338, in various embodiments. The RF input contact 334 is coupled through input circuit 331 to the first output 324 of the power splitter 320, and thus the RF input contact 334 receives the carrier signal produced by the power splitter 320.

Each amplification stage of the carrier amplifier 332 includes a power transistor. In a single-stage carrier amplifier 332, a single power transistor may be implemented on a single power amplifier die. In a multiple-stage carrier amplifier 332, two or more power transistors may be implemented on a single power amplifier die, or each power amplifier may be implemented on a separate die (e.g., dies 433, 434, FIG. 12), as will be exemplified in the power amplifier module depicted in FIG. 12.

Either way, each power transistor includes a control terminal (e.g., a gate terminal) and first and second current-carrying terminals (e.g., a drain terminal and a source terminal). In a single-stage device, which would include a single power transistor, the control terminal is electrically connected to the RF input contact 334, one of the current-carrying terminals (e.g., the drain terminal) is electrically connected to the RF output contact 338, and the other current-carrying terminal (e.g., the source terminal) is electrically connected through ground contact 348 (or one or more ground contact pads) to the ground reference (or another voltage reference). Conversely, a two-stage amplifier would include two power transistors coupled in series, where a first transistor functions as a driver amplifier transistor that has a relatively low gain, and a second transistor functions as a final-stage amplifier transistor that has a relatively high gain. In such an embodiment, the control terminal of the driver amplifier transistor is electrically connected to the RF input contact 334, one of the current-carrying terminals of the driver amplifier transistor (e.g., the drain terminal) may be electrically connected to the control terminal of the final-stage amplifier transistor, and the other current-carrying terminal of the driver amplifier transistor (e.g., the source terminal) is electrically connected through ground contact 348 to the ground reference (or another voltage reference). Additionally, one of the current-carrying terminals of the final-stage amplifier transistor (e.g., the drain terminal) is electrically connected to the RF output contact 338, and the other current-carrying terminal of the final-stage amplifier transistor (e.g., the source terminal) may be electrically connected through ground contact 348 to the ground reference (or another voltage reference).

In addition to the power transistor(s), portions of input and output impedance matching networks and bias circuitry (not illustrated in FIG. 11) also may be included within the carrier amplifier 332 and/or electrically coupled to the carrier amplifier 332. Further, in an embodiment in which the carrier amplifier 332 is a two-stage device, an interstage matching network (not illustrated in FIG. 11) also may be included within the carrier amplifier 332 between the driver and final-stage amplifier transistors.

The RF output contact 338 of the carrier amplifier 332 is coupled to the power combining node 372 through phase shift and impedance inversion element 370, in an embodiment. According to an embodiment, the impedance inversion element is a lambda/4 ($\lambda/4$) transmission line phase shift element (e.g., including a microstrip line and/or lumped elements, and connections to the output terminals of the amplifiers 332, 352), which imparts about a 90 degree relative phase shift to the carrier signal after amplification by the carrier amplifier 332. A first end of the impedance inversion element 370 is coupled to the RF output contact 338 of the carrier amplifier 332, and a second end of the phase shift element 370 is coupled to the power combining node 372.

Reference is now made to the peaking amplifier path 350, which includes a peaking amplifier 352 and an input circuit 351 (e.g., including an impedance matching circuit), in an embodiment. The peaking amplifier 352 includes an RF input contact 354 (or one or more input contact pads), an RF output contact 358 (or one or more output contact pads), and one or more amplification stages coupled between the input and output terminals 354, 358, in various embodiments. The RF input contact 354 is coupled to the second output 326 of the power splitter 320, and thus the RF input contact 354 receives the peaking signal produced by the power splitter 320.

As with the carrier amplifier 332, each amplification stage of the peaking amplifier 352 includes a power transistor with a control terminal and first and second current-carrying terminals. The power transistor(s) of the peaking amplifier 352 may be electrically coupled between the RF input and output terminals 354, 358 and to the ground contact 348 in a manner similar to that described above in conjunction with the description of the carrier amplifier 332. Additional other details discussed with in conjunction with the description of the carrier amplifier 332 also apply to the peaking amplifier 352, and those additional details are not reiterated here for brevity. However, one important point to reiterate is that a current-carrying terminal of each peaking amplifier transistor (e.g., the source terminal of a driver and/or final-stage peaking amplifier transistor) may be electrically connected through an embodiment of a ground contact 348 to the ground reference (or another voltage reference), as described above in conjunction with the description of the carrier amplifier 332.

The RF output contact 358 of the peaking amplifier 352 is coupled to the power combining node 372. According to an embodiment, the RF output contact 358 of the peaking amplifier 352 and the combining node 372 are implemented with a common physical element. More specifically, in an embodiment, the RF output contact 358 of the peaking amplifier 352 is configured to function both as the combining node 372 and as the output contact 358 of the peaking amplifier 352. To facilitate combination of the amplified carrier and peaking signals, and as mentioned above, the RF output contact 358 (and thus the combining node 372) is connected to the second end of the phase shift and impedance inversion element 370. In other embodiments, the combining node 372 may be a separate element from the RF output contact 358.

Either way, the amplified carrier and peaking RF signals combine in phase at the combining node 372. The combining node 372 is electrically coupled to the RF output terminal 314 to provide the amplified and combined RF output signal to the RF output terminal 314. In an embodiment, an output impedance matching network 374 between the combining node 372 and the RF output terminal 314 functions to present proper load impedances to each of the carrier and peaking amplifier 332, 352. The resulting amplified RF output signal is produced at RF output terminal 314, to which an output load 390 (e.g., an antenna) is connected.

Amplifier 310 is configured so that the carrier amplifier path 330 provides amplification for relatively low level input signals, and both amplification paths 330, 350 operate in combination to provide amplification for relatively high level input signals. This may be accomplished, for example, by biasing the carrier amplifier 332 so that the carrier amplifier 332 operates in a class AB mode, and biasing the peaking amplifier 352 so that the peaking amplifier 352 operates in a class C mode.

In the embodiment illustrated in FIG. 3 and described above, splitter 320 imparts about 90 degrees of phase shift to the peaking signal prior to amplification, and phase shift and impedance inversion element 370 similarly imparts about 90 degrees of phase shift to the amplified carrier signal so that the amplified carrier and peaking signals may combine in phase at the combining node 372. Such an architecture is referred to as a non-inverted Doherty amplifier architecture. In an alternate embodiment, splitter 320 may impart about 90 degrees of phase shift to the carrier signal prior to amplification, rather than to the peaking signal, and the combining node 372 may be included instead at the output (e.g., at output contact 338) of the carrier amplifier. Such an alternate architecture is referred to as an inverted Doherty amplifier architecture. In still other alternate embodiments, other combinations of phase shift elements may be implemented in the carrier and/or peaking paths 330, 350 prior to amplification to achieve about 90 degrees of phase difference between the carrier and peaking signals prior to amplification, and the phase shifts applied to the amplified carrier and peaking signals may be selected accordingly to ensure that the signals combine in phase at combining node 372.

As with the above-described embodiments of single-path amplifiers depicted in FIGS. 8-10, embodiments of power amplifier modules that include multiple-path amplifiers may include all flip-chip power transistor dies, all non-flip-chip power transistor dies, or various combinations of flip-chip and non-flip-chip power transistor dies. FIGS. 12-15, described below, depict two embodiments of multiple-path amplifiers (in this case, Doherty power amplifiers) that include two specific combinations of flip-chip and non-flip-chip power transistor dies. Although two specific combinations are illustrated and discussed, those of skill in the art would understand, based on the description herein, that other combinations of flip-chip and non-flip-chip power transistor dies also may be implemented in other embodiments of power amplifier modules. Further, although FIGS. 12-15 specifically pertain to Doherty power amplifiers, those of skill in the art would understand, based on the description herein, that combinations of flip-chip and non-flip-chip power transistor dies also may be used in other types of multiple-path amplifiers. Accordingly, the scope of the inventive subject matter is not limited only to the illustrated example embodiments.

Figure 12:
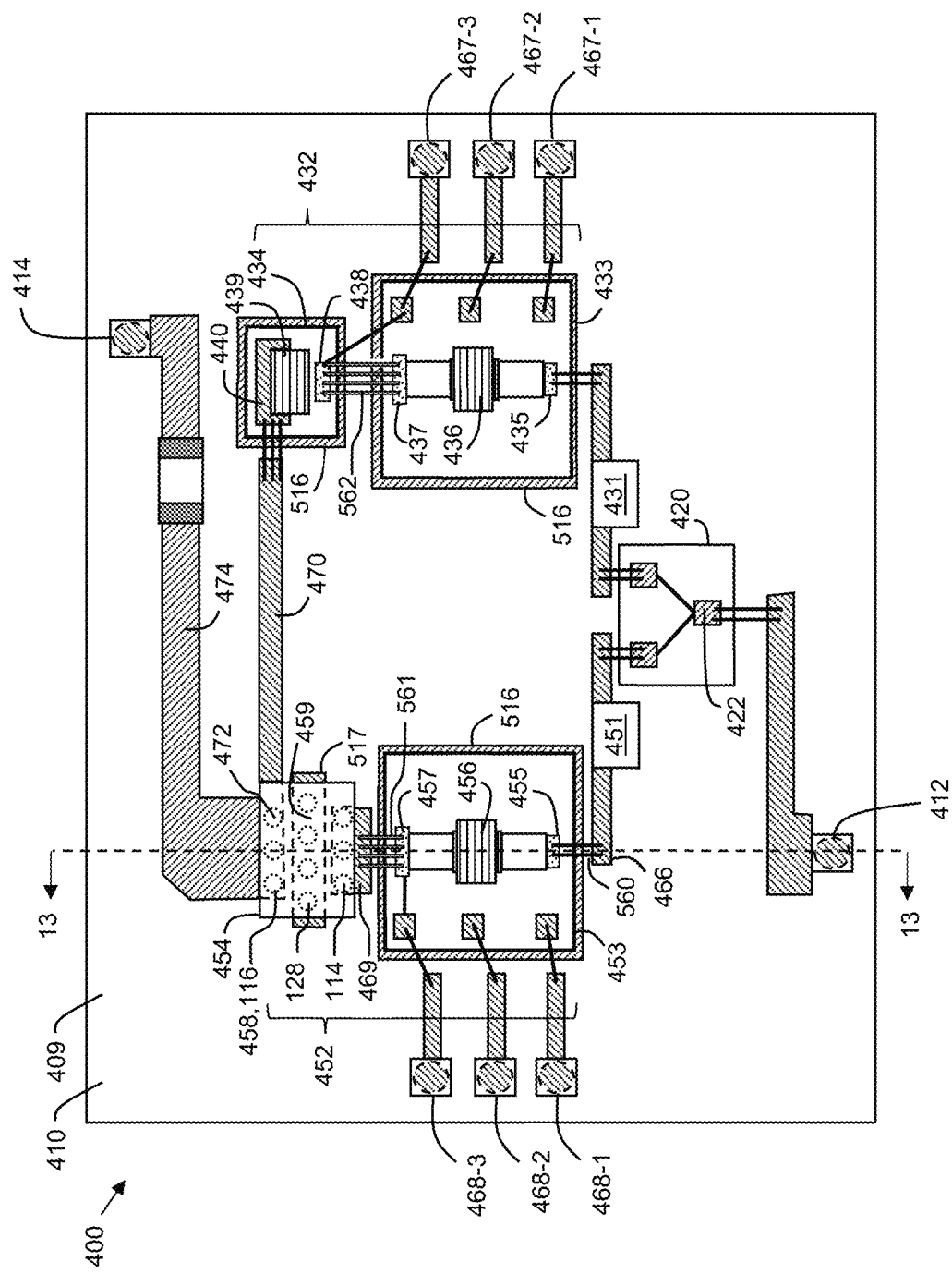
FIG. 12 shows a plan view of a power amplifier module that embodies the Doherty power amplifier of FIG. 11, and that includes at least one semiconductor device having the flip-chip topology and at least one other semiconductor device having a non-flip-chip topology in accordance with another embodiment.
Figure 13:
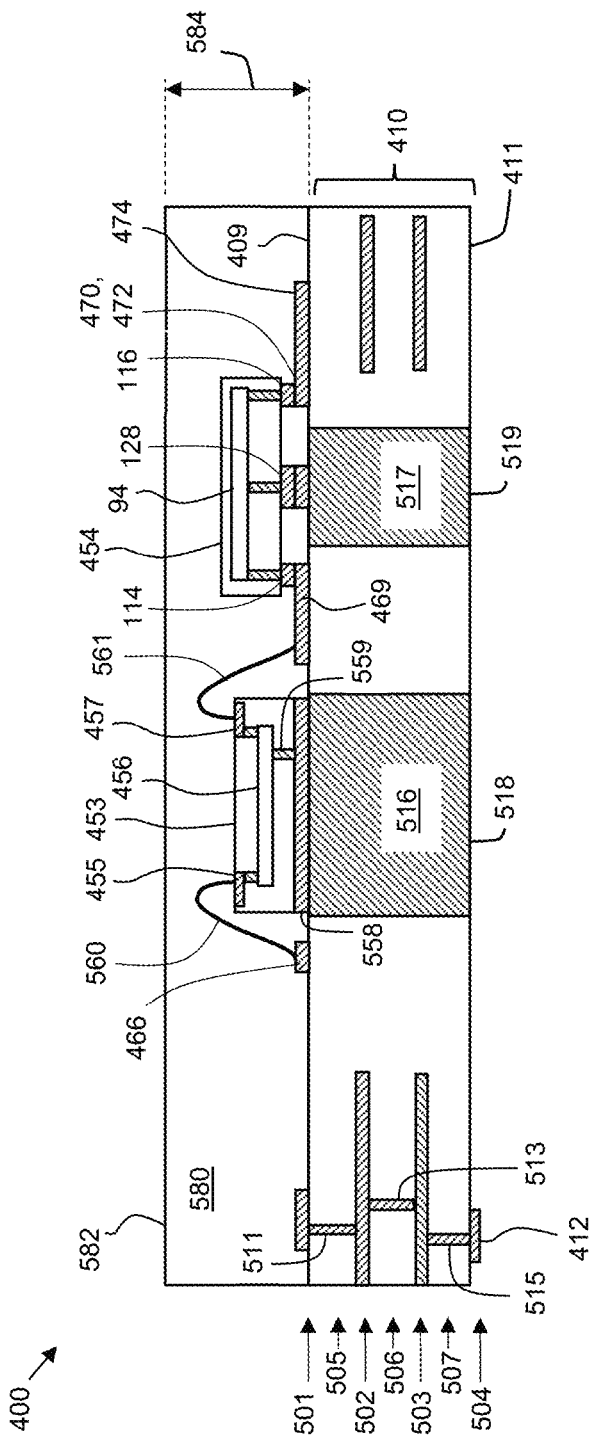
FIG. 13 shows a side, cross-sectional view of the Doherty power amplifier module of FIG. 12 along line 13-13.

In the Doherty amplifier module embodiment illustrated in FIGS. 12 and 13, only one of four power transistor dies is a flip-chip die, and the remaining three dies are non-flip-chip dies. Conversely, in the Doherty amplifier module embodiment illustrated in FIGS. 14 and 15, three of the four transistor power transistor dies are flip-chip dies, and the remaining die is a non-flip-chip die.

The heat that each of the dies are expected to produce during operation is one important consideration to take into account in determining which die(s) to implement as flip-chip die(s) and which other die(s) to implement as non-flip-chip dies. For dies that are likely to produce more heat than can be absorbed by the module substrate and encapsulant material, a non-flip-chip die configuration may be desirable, as the excess heat may be carried through a thermally conductive feature in the module substrate that underlies the die (e.g., conductive ground feature 516, FIGS. 12-15). A corresponding heat dissipation structure in the system substrate may be used to carry the excess heat away from the module. Conversely, for dies that are not likely to produce more heat than can be absorbed by the module substrate and the encapsulant material, no such thermally conductive feature is necessary, and the area of the module substrate underlying the die may be used to connect to source vias.

In the embodiment of FIGS. 12 and 13, only the peaking amplifier, final-stage transistor die (i.e., die 454) is implemented as a flip-chip die, as this die is not anticipated to produce more heat than can be absorbed by the module substrate and the encapsulant material. Heat produced by the other three die (i.e., the carrier driver-stage and final-stage dies 433, 434 and the peaking driver-stage die 453) is absorbed by conductive features (i.e., features 516) underlying the dies. Conversely, in the embodiment of FIGS. 14 and 15, the peaking driver-stage and final-stage dies (i.e., dies 653, 454) and the carrier driver-stage die (i.e., die 633) are implemented as flip-chip dies, as these dies are not anticipated to produce more heat than can be absorbed by the module substrate and the encapsulant material. Heat produced by the other die (i.e., the carrier final-stage die 434) is absorbed by a conductive feature (i.e., feature 516) underlying the die.

Referring now to FIG. 12, a plan view is shown of a power amplifier module 400 that embodies the Doherty power amplifier 310 of FIG. 11, and that includes one semiconductor device having the flip-chip topology and three other semiconductor devices having a non-flip-chip topology in accordance with an embodiment. For enhanced understanding, FIG. 12 should be viewed simultaneously with FIG. 13, which shows a side, cross-sectional view of the Doherty power amplifier module of FIG. 12 along line 13-13.

Essentially, power amplifier module 400 includes a Doherty power amplifier (e.g., power amplifier 310, FIG. 11) implemented with a multi-layer module substrate 410 and a plurality of power transistor dies 433, 434, 453, 454 and other electrical components. As will be described in more detail below, power amplifier module 400 has a combination of flip-chip and non-flip-chip dies. More specifically, power transistor dies 433, 434, 453 are configured as "non-flip-chip" dies (e.g., similar to dies 30, 210, 270, FIGS. 2, 3, 9, 10), and power transistor die 454 is configured as a "flip-chip" die (e.g., similar to dies 70, 160, 170, 220, 260, FIGS. 5, 8-10). Accordingly, power transistor dies 433, 434, 453 may include TSVs (e.g., source vias 40, FIG. 3), but power transistor die 454 does not include TSVs. In addition, power amplifier module 400 includes a plurality of terminals 412, 414, 467-1, 467-2, 467-3, 468-1, 468-2, 468-3 for conveying signals or bias voltages, or for connecting to ground references, as will be discussed in detail below.

Power amplifier module 400 includes a module substrate 410 in the form of a multiple-layer printed circuit board (PCB) or other suitable substrate. The module substrate 410 has a top surface 409 (also referred to as a "front-side" or "mounting surface") and a bottom surface 411 (also referred to as a "back-side"). As will be described in more detail below, a plurality of components are coupled to the mounting surface 409 of the module substrate 410, and non-conductive encapsulant material 580 (e.g., a plastic encapsulant) is disposed on the mounting surface 409 and over and around the components to define a top surface 582 of the module 400. As shown in FIG. 13, the encapsulant material 580 has a thickness 584 that is greater than the maximum height of the components (e.g., splitter 420 and power transistor dies 433, 434, 453, 454) that are covered by the encapsulant material 580.

In the illustrated embodiments, and to facilitate surface mounting of module 400 to an external system substrate (not illustrated), various conductive input/output and voltage reference terminals 412, 414, 467-1, 467-2, 467-3, 468-1, 468-2, 468-3 (shown with dashed outlines in the view of FIG. 12, as they would be hidden in FIG. 12) are exposed at the bottom surface 411 of the module substrate 410, and are electrically connected to conductive features (e.g., traces) at the top surface 409 through conductive vias (e.g., vias 511, 512, 513) that extend through the module substrate 410. In such embodiments, and as best shown in FIG. 13, external electrical connectivity to the components coupled to the module top surface 409 is made through the exposed terminals (e.g., terminal 412) at the bottom surface 411 of the module substrate 410.

In other embodiments, one or more terminal-containing interposers (not illustrated) may be connected to conductive features (e.g., traces and/or pads) at the top surface 409 of the module substrate 410, and the interposers may extend to a height (e.g., about equal to thickness 584) above the top surface 409 of the module substrate 410. Each interposer terminal may include conductive pads at the bottom and top interposer surfaces, along with a conductive via extending through the interposer between the interposer's conductive pads. In such an embodiment, once the encapsulant material 580 has been applied, the pads at the top surfaces of the interposer(s) would be exposed to facilitate surface mounting of module 400 to an external system substrate (not shown). Accordingly, in such embodiments, electrical connectivity (through the interposer terminals) to the components coupled to the module top surface 409 would be made through the exposed terminals at the top surface 582 of the encapsulant 580 and module 400.

As depicted in FIG. 13, the module substrate 410 includes a plurality of dielectric layers 505, 506, 507 (e.g., formed from FR-4, ceramic, or other PCB dielectric materials), in an alternating arrangement with a plurality of conductive layers 501, 502, 503, 504, where a top surface 409 of the module substrate 410 is defined by a patterned conductive layer 501, and a bottom surface 511 of the module substrate 410 is defined by a patterned conductive layer or terminal layer 504. It should be noted that, although module substrate 410 is shown to include three dielectric layers 505-507 and four conductive layers 501-504, other embodiments of a module substrate may include more or fewer dielectric layers and/or conductive layers.

Each of the various conductive layers 501-504 may have a primary purpose, and also may include conductive features that facilitate signal and/or voltage/ground routing between other layers. For example, in an embodiment, the patterned conductive layer 501 at the mounting surface 409 of the module substrate 410 may primarily function as a signal conducting layer. More specifically, layer 501 includes a plurality of conductive features (e.g., conductive pads and traces) which may serve as attachment points for dies 433, 434, 453, 454 and other discrete components, and also provide electrical connectivity between the dies 433, 434, 453, 454 and the other discrete components. In addition, layer 504 may include or be coupled to a plurality of conductive pads (e.g., pads 512, 561, 562, FIG. 13) that are specifically designated as signal, bias, and/or ground terminals (e.g., terminals 412, 414, 467-1, 467-2, 467-3, 468-1, 468-2, 468-3). The other layers (e.g., layers 502, 503) may function as RF ground layers, bias voltage routing layers, and/or signal routing layers.

According to an embodiment, module substrate 410 also includes one or more conductive ground features 516, 517 (e.g., ground features 68, 185, 186, 205, 236, 255, 286, FIGS. 3, 8-10), which also may function as thermal dissipation structures. These ground features 516, 517 extend between the top and bottom surfaces 409, 411 of the module substrate 410. In the embodiment of FIGS. 12 and 13, "non-flip-chip" dies 433, 434, 453 each include a conductive bottom layer 558 (e.g., layer 58, FIG. 3), which is physically and electrically coupled to surfaces of the ground features 516 that are exposed at the top surface 409 of the module substrate 410. As discussed above in conjunction with FIGS. 2 and 3, gate and drain contact pads 455, 457 (e.g., gate and drain contact pads 44, 46, FIGS. 2, 3) are located at the upper surface of the non-flip-chip dies 433, 434, 453, and electrical connection to the internal gate and drain structures are made through wirebonds 560, 561 (e.g., wirebonds 60, FIGS. 2, 3) connected between the gate and drain contact pads 455, 457 and bond pads or traces 466, 469 on the mounting surface 409 of the module substrate 410. Conversely, electrical connection to the source regions of the dies 433, 434, 434 are made through source vias 559 (e.g., source vias 40, FIGS. 2, 3) and the conductive bottom layer 558 (i.e., conductive layer 58, FIG. 3).

In contrast, "flip-chip" die 454 includes gate, drain, and source contact pads 114, 116, 128 (e.g., gate, drain, and source contact pads 114, 116, 128, FIG. 5) exposed at a same surface of the die 454. The source contact pad(s) 128 (or ground contact pads) are physically and electrically coupled to the surface of the ground feature 517 that is exposed at the top surface 409 of the module substrate 410. In addition, the gate and drain contact pads 114, 116 (or I/O contact pads) are physically and electrically coupled to bond pads or traces 469, 470, 472 on the mounting surface 409 of the module substrate 410 (e.g., using connection elements 90, FIG. 4, such as pillars, solder balls, or other contact extensions).

The bottom surfaces 518, 519 of the ground features 516, 517 may be exposed at the bottom surface 411 of the module substrate 410, as shown in FIG. 13. Either way, the ground features 516, 517 are configured to provide electrical and thermal pathways between the dies 433, 434, 453, 454 and the bottom surfaces 518, 519 of the ground features 516, 517 (and thus the bottom surface 411 of the module substrate 410). In various embodiments, the ground features 516, 517 may include conductive metallic coins that are press-fit and/or attached into through-holes that extend between the surfaces 409, 411 of the module substrate 410. In alternate embodiments, each of the ground features 516, 517 may include a plurality (or set) of conductive thermal vias (e.g., circular or bar vias) that extend between the surfaces 409, 411 of the module substrate 410. When integrated into a larger electrical system, the exposed bottom surfaces 518, 519 of the ground features 516, 517 are physically and thermally coupled to another ground feature of the system and/or to a heat sink.

The power amplifier module 400 includes an RF signal input terminal 412 (e.g., RF input terminal 312, FIG. 11), a power splitter 420 (e.g., power splitter 320, FIG. 11), a two-stage, carrier amplifier 432 (e.g., amplifier 332, FIG. 11), a two-stage peaking amplifier 452 (e.g., amplifier 352, FIG. 11), various phase shift and impedance matching elements, a combining node 472 (e.g., combining node 372, FIG. 11), an output impedance matching network 474 (e.g., network 374, FIG. 11), and an RF signal output terminal 414 (e.g., RF output terminal 314, FIG. 11).

Terminal 412 functions as the RF signal input terminal for the module 400. Through one or more conductive structures (e.g., vias, traces, and/or wirebonds, as shown), the RF signal input terminal 412 is electrically coupled to an input 422 to the power splitter 420. Similarly, terminal 414 functions as the RF signal output terminal for the module 400. Through one or more conductive structures (e.g., vias, traces, and/or wirebonds), the RF signal output pad is electrically coupled to the combining node 472 (through network 474).

The power splitter 420 (e.g., power splitter 320, FIG. 11), which is coupled to the mounting surface 409 of the system substrate 410, may include one or more discrete die and/or components, although it is represented in FIG. 4 as a single element. The power splitter 420 includes an input terminal 422 and two output terminals (not numbered, but corresponding to terminals 324, 326, FIG. 11). The input terminal 422 is electrically coupled through one or more conductive structures (e.g., vias, traces, and/or wirebonds, as shown) to the RF signal input terminal 412, and thus is configured to receive an input RF signal. The output terminals of the power splitter 420 are electrically coupled through one or more conductive structures (e.g., vias, traces, and/or wirebonds) and input circuits 431, 451 (e.g., input circuits 331, 351, FIG. 11) to input contact pads 435, 455 for the carrier and peaking amplifiers 432, 452, respectively.

The power splitter 420 is configured to split the power of the input RF signal received through the RF input terminal 412 into first and second RF signals, which are produced at the output terminals of the power splitter 420. In addition, the power splitter 420 may be configured to impart about a 90 degree phase difference between the RF signals provided at the splitter output terminals. The first and second RF signals produced at the outputs of the power splitter 420 may have equal or unequal power, as described previously.

The first output of the power splitter is electrically coupled to a carrier amplifier path (i.e., to the carrier amplifier 432 or carrier amplifier path 330, FIG. 11), and the second output of the power splitter is electrically coupled to a peaking amplifier path (i.e., to the peaking amplifier 452 or peaking amplifier path 450, FIG. 11). The first RF signal produced by the power splitter 420 is amplified through the carrier amplifier path 432, and the second RF signal produced by the power splitter 420 is amplified through the peaking amplifier path 452.

In the specific embodiment of FIG. 12, each of the carrier and peaking amplifier paths includes a two-stage power amplifier 432, 452, where a driver-stage transistor 436, 456 is implemented on a driver-stage die 433, 453, and a final-stage transistor 439, 459 is implemented on a separate final-stage die 434, 454.

In a specific embodiment, the carrier amplifier 432 includes a silicon driver-stage die 433 and a gallium nitride (GaN) final-stage die 434, and the peaking amplifier 452 also includes a silicon driver-stage die 453 and a GaN final-stage die 454. In other embodiments, each of the carrier and peaking amplifiers 432, 452 may include a two-stage power amplifier implemented on a single die, or each of the carrier and peaking amplifiers 432, 452 may include a single-stage power amplifier implemented on a single die. In still other embodiments, each of the carrier and peaking amplifiers may include a two-stage power amplifier implemented on separate driver and final-stage dies, but the driver and final-stage dies may be formed using the same semiconductor technology (e.g., both the driver and final-stage dies are silicon dies or GaN dies), or the driver and/or final-stage dies may be formed using different semiconductor technologies than those described above (e.g., the driver and/or final-stage dies may be formed from silicon germanium (SiGe) and/or gallium arsenide (GaAs) die).

The carrier amplifier path includes the above-mentioned driver-stage die 433, the final-stage die 434, and a phase shift and impedance inversion element 470 (e.g., element 370, FIG. 11). The driver-stage die 433 and the final-stage die 434 of the carrier amplifier path 432 are electrically coupled together in a cascade arrangement between an input contact pad 435 of the driver-stage die 433 (corresponding to a carrier amplifier input) and an output contact pad 440 of the final-stage die 434 (corresponding to a carrier amplifier output). According to the illustrated embodiment, both the driver-stage die 433 and the final-stage die 434 are non-flip-chip power transistor dies.

The driver-stage die 433 includes a plurality of integrated circuits. In an embodiment, the integrated circuitry of die 433 includes a series-coupled arrangement of the input contact pad 435 (e.g., input contact pad 335, FIG. 11), an optional input impedance matching circuit (not numbered), a silicon power transistor 436 (or other semiconductor technology transistor), an optional output impedance matching circuit (not numbered), and an output contact pad 437, in an embodiment. More specifically, the gate of the transistor 436 is electrically coupled through the optional input impedance matching circuit to the input contact pad 435, and the drain of the transistor 436 is electrically coupled through the optional output impedance matching circuit to the output contact pad 437 of die 433. The source of transistor 436 is electrically coupled to a conductive layer (or source contact or source contact pad) on a bottom surface of die 433, and the bottom conductive layer is physically, electrically, and thermally coupled to the exposed top surface of a ground feature 516.

The output contact pad 437 of the driver-stage die 433 is electrically coupled to the input contact pad 438 of the final-stage die 434 through a wirebond array 562 or another type of electrical connection. The final-stage die 434 also includes a plurality of integrated circuits. In an embodiment, the integrated circuitry of die 434 includes a series-coupled arrangement of an input contact pad 438, a GaN power transistor 437 (or other semiconductor technology transistor), and an output contact pad 440 (e.g., output contact pad 338, FIG. 11). More specifically, the gate of the transistor 437 is electrically coupled to the input contact pad 438 of die 434, and the drain of the transistor 437 is electrically coupled to the output contact pad 440 of die 434. The source of transistor 437 is electrically coupled to a conductive layer (or source contact or source contact pad) on a bottom surface of die 434, and the bottom conductive layer is physically, electrically, and thermally coupled to the exposed top surface of a ground feature 516.

The peaking amplifier path includes the above-mentioned driver-stage die 453 and the final-stage die 454. The driver-stage die 453 and the final-stage die 454 of the peaking amplifier path 452 are electrically coupled together in a cascade arrangement between an input contact pad 455 of the driver-stage die 453 (corresponding to a peaking amplifier input) and an output contact pad 458 of the final-stage die 454 (corresponding to a peaking amplifier output). According to the illustrated embodiment, and as best seen in FIG. 13, the driver-stage die 453 is a non-flip-chip power transistor die, and the final-stage die 454 is a flip-chip power transistor die.

The driver-stage die 453 includes a plurality of integrated circuits. In an embodiment, the integrated circuitry of die 453 includes a series-coupled arrangement of the input contact pad 455 (e.g., input terminal 355, FIG. 11), an optional input impedance matching circuit (not numbered), a silicon power transistor 456 (or other semiconductor technology transistor), an optional output impedance matching circuit (not numbered), and an output contact pad 457, in an embodiment. The input contact pad 455 is electrically coupled through a wirebond array 560 to a conductive trace and/or bond pad 466 on the mounting surface 409 of the module substrate 410. The gate of the transistor 456 is electrically coupled through the optional input impedance matching circuit to the input contact pad 455, and the drain of the transistor 456 is electrically coupled through the optional output impedance matching circuit to the output contact pad 457 of die 453. The source of transistor 456 is electrically coupled to a conductive layer 558 (or source contact or source contact pad) on a bottom surface of die 453, and the bottom conductive layer 558 is physically, electrically, and thermally coupled to the exposed top surface of a ground feature 316.

The output contact pad 457 of the driver-stage die 453 is electrically coupled to one or more input contact pads 114 of the final-stage die 454 through a wirebond array 561 and a conductive trace and/or bond pad 469 on the mounting surface 409 of the module substrate 410. The final-stage die 454 also includes a plurality of integrated circuits. In an embodiment, the integrated circuitry of die 454 includes a series-coupled arrangement of one or more input contact pads 114, a GaN power transistor (or other semiconductor technology transistor) within an active area 94 of the die 454, and one or more output contact pads 116 (e.g., output contact pad 358, FIG. 11). More specifically, the gate of the transistor is electrically coupled to the input contact pad(s) 114 of die 454, and the drain of the transistor is electrically coupled to the output contact pad(s) 116 of die 454. The source of the transistor is electrically coupled to one or more source contact pads 128 on a bottom surface of die 454, and the source contact pad(s) 128 are physically, electrically, and thermally coupled to the exposed top surface of a ground feature 517.

As mentioned previously, for proper Doherty operation, the carrier amplifier 432 may be biased to operate in a class AB mode, and the peaking amplifier 452 may be biased to operate in a class C mode. To accomplish this biasing, a plurality of gate and drain bias voltages may be provided by external bias voltage sources. According to an embodiment, the bias voltages are provided through bias terminals 467-1, 468-1, 467-2, 468-2, 467-3, 468-3 of the module substrate 410. More specifically, gate bias voltages for driver-stage transistors 436, 456 may be provided through driver gate bias terminals 467-1 and 468-2, drain bias voltages for driver-stage transistors 436, 456 may be provided through driver drain bias terminals 467-2, 468-2, and gate bias voltages for final-stage transistors 439, 459 may be provided through gate bias terminals 467-3, 468-3. In the illustrated embodiment, the gate and drain bias contact pads for both the driver- and final-stage transistors 436, 439, 456, 459 are located on the driver-stage dies 433, 453, and the gate bias voltage for the final-stage dies 434, 454 "hops" from the driver-stage dies 433, 453 to the final-stage dies 434, 454 through wirebond connections and/or conductive traces, as shown.

An amplified carrier signal is produced at the output contact pad 440 of the final-stage die 434, and an amplified peaking signal is produced at the output contact pad(s) 116 of the final-stage die 454, which also functions as the combining node 472 (e.g., node 372, FIG. 11) for the amplifier. According to an embodiment, the output contact pad 440 of the carrier final-stage die 434 is electrically coupled (e.g., through wirebonds (not numbered) or another type of electrical connection) to a first end of the phase shift and impedance inversion element 470, and the output contact pad(s) 116 of the peaking final-stage die 454 is electrically coupled to a second end of the phase shift and impedance inversion element 470.

According to an embodiment, the phase shift and impedance inversion element 470 may be implemented with a quarter-wavelength or lambda/4 ($\lambda/4$) or shorter transmission line (e.g., a microstrip transmission line on or within the module substrate 410 with an electrical length up to about 90 degrees) that is formed from a portion of the conductive layer 501. As indicated by dashed lines surrounding contact pads 116, an extension of the transmission line may extend under and be electrically connected to the final-stage drain contact pad(s) 116, in an embodiment. As used herein, lambda is the wavelength of an RF signal at the fundamental frequency of operation of the amplifier (e.g., a frequency in a range of about 600 megahertz (MHz) to about 10 gigahertz (GHz) or higher). The combination of the phase shift and impedance inversion element 470 and the wirebond (or other) connections to the output contact pads 440, 116 of dies 434, 454 may impart about a 90 degree relative phase shift to the amplified carrier signal as the signal travels from output contact pad 440 to output contact pad(s) 116/combining node 472. When the various phase shifts imparted separately on the carrier and peaking RF signals through the carrier and peaking paths, respectively, are substantially equal, the amplified carrier and peaking RF signals combine substantially in phase at output contact pad(s) 116/combining node 472.

The output contact pad(s) 116/combining node 472 are electrically coupled through an output impedance matching network 474 (e.g., network 174, FIG. 1) to RF output terminal 414 (e.g., terminal 114, FIG. 1). The output impedance matching network 474 functions to present the proper load impedances to each of carrier and peaking final-stage dies 434, 454. Although shown in a highly simplified form in FIG. 12, the output impedance matching network 474 may include various conductive traces, additional discrete components (e.g., capacitors, inductors, and/or resistors) between output contact pad(s) 116/combining node 472 and RF output terminal 414, which provide the desired impedance matching.

In the Doherty amplifier module embodiment illustrated in FIGS. 12 and 13, only the peaking final-stage die 454 is a flip-chip die, and the remaining three dies 433, 434, 453 are non-flip-chip dies. In this embodiment, the module substrate 410 and the encapsulant material 580 should be sufficient to absorb heat produced by the peaking final-stage die 454. In other embodiments, other ones of the dies may be of sufficiently low power that the module substrate 410 and the encapsulant material 580 is sufficient to absorb heat produced by those other dies.

Figure 14:
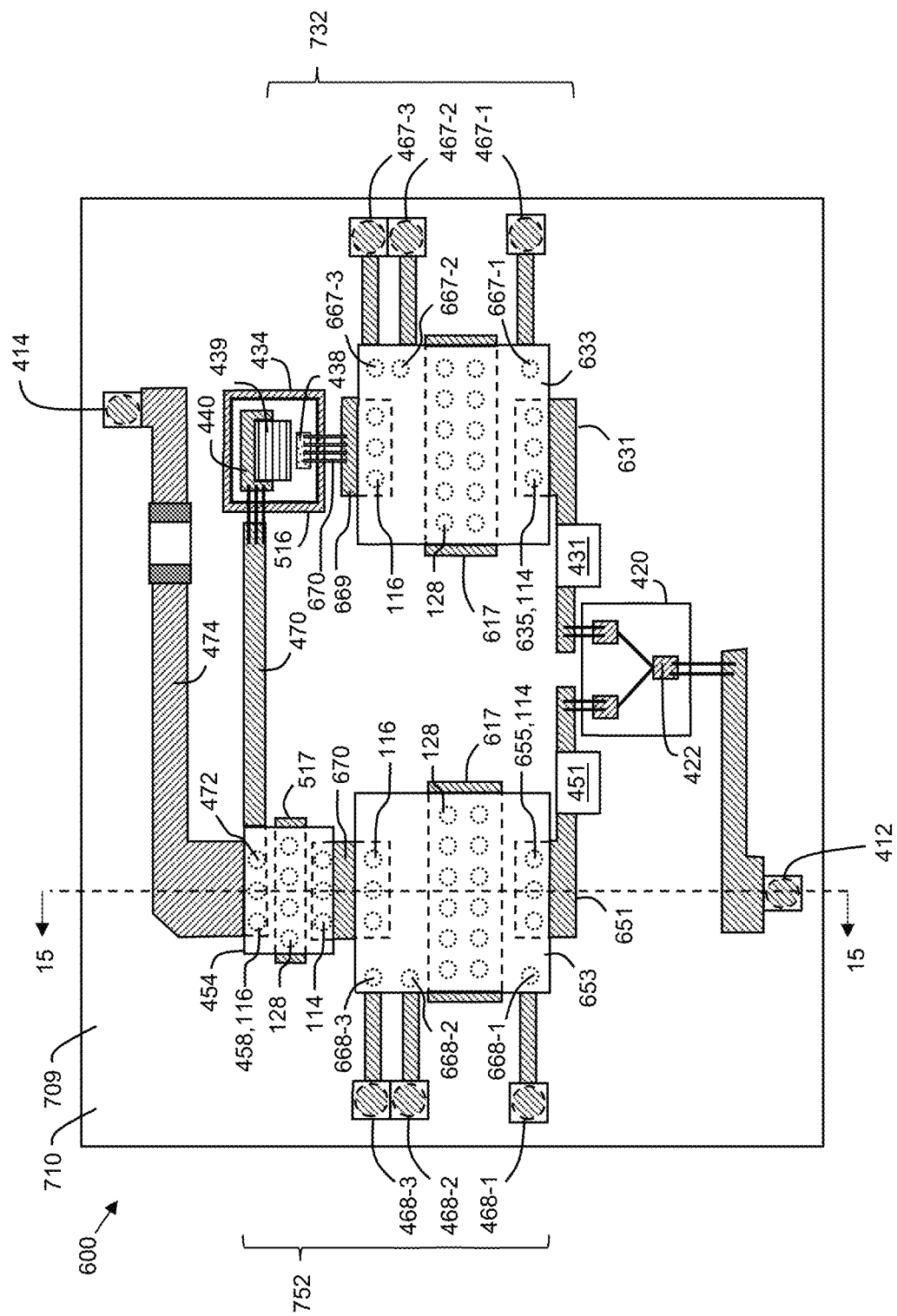
FIG. 14 shows a plan view of a power amplifier module that embodies the Doherty power amplifier of FIG. 11, and that includes at least one semiconductor device having the flip-chip topology and at least one other semiconductor device having a non-flip-chip topology in accordance with yet another embodiment.

For example, FIG. 14 shows a plan view of a power amplifier module 600 that embodies the Doherty power amplifier of FIG. 11, and that includes three dies 633, 653, 454 having the flip-chip topology and only one die 434 having a non-flip-chip topology in accordance with yet another embodiment. For enhanced understanding, FIG. 14 should be viewed simultaneously with FIG. 15, which shows a side, cross-sectional view of the Doherty power amplifier module 600 of FIG. 14 along line 15-15.

Figure 15:
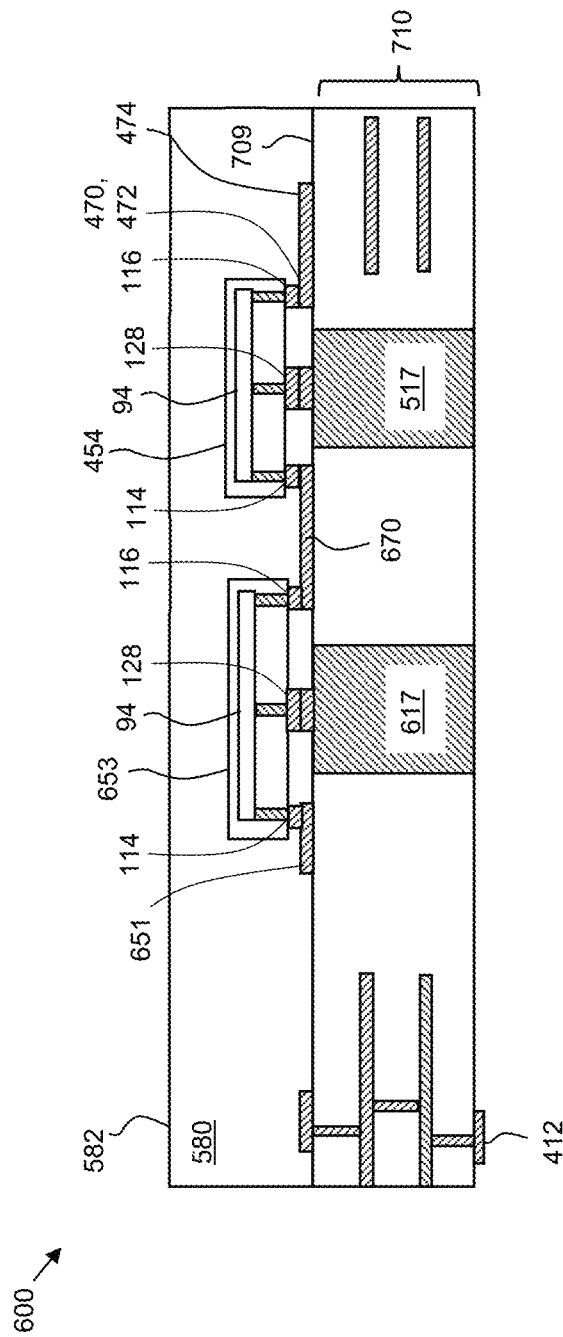
FIG. 15 shows a side, cross-sectional view of the Doherty power amplifier module of FIG. 14 along line 15-15.

The embodiment of FIGS. 14 and 15 has a number of substantially similar or identical features to the embodiment of FIGS. 12 and 13. For the purpose of brevity, those substantially similar or identical features are not re-described in detail below. In any case in which the reference numbers between the drawings are identical (e.g., reference number 412 in each of FIGS. 12-15), the above description of the element associated with that reference number is intended to pertain to the element with the same reference number in FIGS. 14 and 15.

Similar to module 400 (FIGS. 12 and 13), module 600 includes a module substrate 710 in the form of a multiple-layer PCB or other suitable substrate. A plurality of components are coupled to the mounting surface 709 of the module substrate 710, and non-conductive encapsulant material 580 (e.g., a plastic encapsulant) is disposed on the mounting surface 709.

Further, the power amplifier module 600 includes an RF signal input terminal 412 (e.g., RF input terminal 312, FIG. 11), a power splitter 420 (e.g., power splitter 320, FIG. 11), a two-stage, carrier amplifier 732 (e.g., amplifier 332, FIG. 11), a two-stage peaking amplifier 752 (e.g., amplifier 352, FIG. 11), various phase shift and impedance matching elements, a combining node 472 (e.g., combining node 372, FIG. 11), an output impedance matching network 474 (e.g., network 374, FIG. 11), and an RF signal output terminal 414 (e.g., RF output terminal 314, FIG. 11).

The power splitter 420 is configured to split the power of the input RF signal received through the RF input terminal 412 into first and second RF signals, which are produced at the output terminals of the power splitter 420. In the specific embodiment of FIG. 14, each of the carrier and peaking amplifier paths includes a two-stage power amplifier 732, 752, where a driver-stage transistor is implemented on a driver-stage die 633, 653, and a final-stage transistor is implemented on a separate final-stage die 434, 454. In a specific embodiment, the carrier amplifier 732 includes a silicon driver-stage die 633 and a GaN final-stage die 434, and the peaking amplifier 752 also includes a silicon driver-stage die 653 and a GaN final-stage die 454, although each of the dies 633, 452, 653, 454 may be formed using other semiconductor materials, as discussed above in conjunction with FIG. 12.

The carrier amplifier path 732 includes the driver-stage die 633, the final-stage die 434, and a phase shift and impedance inversion element 470 (e.g., element 370, FIG. 11). The driver-stage die 633 and the final-stage die 434 are electrically coupled together in a cascade arrangement between one or more input contact pad(s) 635/114 of the driver-stage die 633 (corresponding to a carrier amplifier input) and an output contact pad 438 of the final-stage die 454 (corresponding to a carrier amplifier output). According to the illustrated embodiment, the driver-stage die 433 is a flip-chip power transistor die, and the final-stage die 434 is a non-flip-chip power transistor die. Accordingly, the final-stage die 434 may include TSVs (e.g., source vias 40, FIG. 3), but the driver-stage die 433 does not include TSVs, in an embodiment.

The peaking amplifier path 752 includes the driver-stage die 653 and the final-stage die 454 electrically coupled together in a cascade arrangement between one or more input contact pads 655/114 of the driver-stage die 653 (corresponding to a peaking amplifier input) and one or more output contact pads 458/116 of the final-stage die 454 (corresponding to a peaking amplifier output). According to the illustrated embodiment, both the driver-stage die 653 and the final-stage die 454 are flip-chip power transistor dies. Accordingly, neither the driver-stage die 633 nor the final-stage die 434 include TSVs (e.g., source vias 40, FIG. 3), in an embodiment.

The primary difference between the module 600 of FIGS. 14 and 15 and the module 400 of FIGS. 12 and 13 is that the driver-stage dies 433, 453 of module 400 are both non-flip-chip dies, as described above, whereas the driver-stage dies 633, 653 of module 600 are both flip-chip dies. Accordingly, each of the driver-stage dies 633, 653 includes a plurality of integrated circuits, including a series-coupled arrangement of input contact pad(s) 114, a silicon power transistor within an active area 94 (or other semiconductor technology transistor) of each die 633, 653, and output contact pad(s) 116. More specifically, the gate of each driver-stage transistor is electrically coupled to the input contact pad(s) 114 of each die 633, 653, and the drain of each driver-stage transistor is electrically coupled to the output contact pad(s) 116 of each die 633, 653. The source of each driver-stage transistor is electrically coupled to one or more source contact pads 128 on a bottom surface of the respective die 633, 653, and the source contact pad(s) 128 are physically, electrically, and thermally coupled to the exposed top surface of a ground feature 617.

Several additional differences between the modules 400, 600 are found in the electrical connections between the driver-stage dies 633, 653 and conductive features of the module substrate 600. More specifically, in the previously-described module 400, the driver-stage dies 433, 453 (FIGS. 12, 13) are non-flip-chip dies that are electrically coupled to conductive features (e.g., features 466, 469, FIGS. 12, 13) using wirebonds (e.g., wirebonds 560, 561, FIG. 13). In contrast, in module 600, the driver-stage dies 633, 653 are flip-chip dies, so the input and output contact pads 114, 116 of the driver-stage dies 633, 653 (FIGS. 14, 15) are directly connected (e.g., using connection elements 90, FIG. 4, such as pillars, solder balls, or other contact extensions) to conductive bond pads or traces 631, 651, 669, 670 at the mounting surface 409 of the module substrate 710. The source contact pad(s) 128 of the driver-stage dies 633, 653 are physically and electrically coupled to the surface of the ground features 617 that are exposed at the top surface 709 of the module substrate 710.

Another more subtle difference between the modules 400, 600 is the manner in which the bias voltages are provided to/through the driver-stage transistors from external bias voltage sources. In both embodiments, the bias voltages are provided through bias terminals 467-1, 468-1, 467-2, 468-2, 467-3, 468-3 of the module substrate 410, 710. Unlike module 400 in which the bias terminals are coupled to the driver-stage transistors 433, 453 using wirebond connections, however, in module 710, the bias terminals are directly connected (e.g., using connection elements 90, FIG. 4, such as pillars, solder balls, or other contact extensions) to bias contact pads 667-1, 667-2, 667-3, 668-1, 668-2, 668-3 on the module-facing surfaces of the driver-stage dies 633, 653.

More specifically, gate bias voltages for driver-stage transistors may be provided through driver gate bias terminals 467-1, 468-2 and driver-stage die terminals 667-1, 668-1, drain bias voltages for driver-stage transistors may be provided through driver drain bias terminals 467-2, 468-2 and driver-stage die contact pads 667-2, 668-2, and gate bias voltages for the final-stage transistors in final-stage dies 434, 454 may be provided through gate bias terminals 467-3, 468-3 and driver-stage die contact pads 667-3, 668-3. In the illustrated embodiment, the gate and drain bias pads for both the driver- and final-stage transistors 436, 439, 456, 459 are located on the driver-stage dies 633, 653, and the gate bias voltage for the final-stage dies 434, 454 "hops" from the driver-stage dies 433, 453 to the final-stage dies 434, 454 through conductive traces, as shown.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:
1. An amplifier module comprising:
    a module substrate having a mounting surface and a plurality of conductive features at the mounting surface;
    a first power transistor die coupled to the mounting surface, wherein the first power transistor die has first and second input/output (I/O) contact pads and a first ground contact pad, wherein the first and second I/O pads and the first ground contact pad all are exposed at a first surface of the first power transistor die that faces toward the mounting surface of the module substrate; and a second power transistor die coupled to the mounting surface, wherein the second power transistor die has third and fourth I/O contact pads and a second ground contact pad, wherein the third and fourth I/O contact pads are exposed at a first surface of the second power transistor die that faces away from the mounting surface of the module substrate, and the second ground contact pad is exposed at a second surface of the second power transistor die that faces toward the mounting surface of the module substrate.

2. The amplifier module of claim 1, wherein the first and second I/O contact pads are electrically coupled to first and second conductive features at the mounting surface, and the first ground contact pad is coupled to a third conductive feature exposed at the mounting surface.

3. The amplifier module of claim 2, further comprising:
a first wirebond with a first end coupled to a fourth conductive feature at the mounting surface, and a second end coupled to the third I/O contact pad; and
a second wirebond with a first end coupled to a fifth conductive feature at the mounting surface, and a second end coupled to the fourth I/O contact pad.

4. The amplifier module of claim 2, wherein:
the first and second conductive features are conductive traces at the mounting surface; and
the third conductive feature extends between the mounting surface and a bottom surface of the module substrate.

5. The amplifier module of claim 1, wherein:
the first power transistor die includes one or more field effect transistors with a first gate structure, a first drain region, and a first source region;
the first I/O contact pad is electrically coupled to the first gate structure;
the second I/O contact pad is electrically coupled to the first drain structure; and
the first ground contact pad is electrically coupled to the first source region.

6. The amplifier module of claim 5, wherein:
the second power transistor die includes one or more additional field effect transistors with a second gate structure, a second drain region, and a second source region;
the third I/O contact pad is electrically coupled to the second gate structure;
the fourth I/O contact pad is electrically coupled to the second drain structure; and
the second ground contact pad is electrically coupled to the second source region.

7. The amplifier module of claim 6, wherein:
the first and second power transistor dies form portions of an amplifier path having an input and an output;
the third I/O contact pad of the second transistor is electrically coupled to the input of the amplifier path;
the fourth I/O contact pad of the second transistor is electrically coupled to the first I/O contact pad of the first transistor; and
the second I/O contact pad of the first transistor is electrically coupled to the output of the amplifier path.

8. The amplifier module of claim 6, wherein:
the first and second power transistor dies form portions of an amplifier path having an input and an output;
the first I/O contact pad of the first transistor is electrically coupled to the input of the amplifier path;

the second I/O contact pad of the first transistor is electrically coupled to the third I/O contact pad of the second transistor; and
the fourth I/O contact pad of the second transistor is electrically coupled to the output of the amplifier path.

9. The amplifier module of claim 1, wherein the first power transistor die comprises:
a transistor having an active area formed in a die body, the active area being bounded by an outer periphery;
an interconnect structure formed over a frontside of the die body, the interconnect structure containing patterned electrically conductive material defining first, second, and third contacts, which are electrically coupled to first, second, and third subregions, respectively, within the active area of the transistor; and
a frontside I/O interface formed in an outer portion of the interconnect structure, the frontside I/O interface containing the first and second I/O contact pads and the first ground contact pad, the first I/O contact pad being electrically connected to the first contact, the second I/O contact pad being electrically connected to the second contact, and the first ground contact pad being electrically connected the third contact, wherein the first ground contact pad is positioned at a location overlying the active area of the transistor.

10. The amplifier module of claim 9, wherein:
the transistor comprises a field effect transistor (FET);
the first, second, and third subregions comprise channel, drain, and source subregions, respectively, within the active area of the FET; and
the first, second, and third contacts comprise gate, drain, and source electrode structures, respectively.

11. The amplifier module of claim 9, wherein the first and second I/O contact pads are positioned at locations outside the outer periphery of the active area of the transistor.

12. The amplifier module of claim 1, further comprising electrically conductive connection elements on each of the first and second I/O contact pads and the first ground pad configured for flip-chip bonding to the module substrate.

13. The amplifier module of claim 1, wherein the first power transistor die does not include source through substrate vias.

14. A Doherty amplifier module comprising:
a module substrate having a mounting surface and a plurality of conductive features at the mounting surface;
a first amplifier path that includes a first input, a first output, and a first power transistor die coupled to the mounting surface, wherein the first power transistor die has a first input/output (I/O) contact pad coupled to the first input, a second I/O contact pad coupled to the first output, and a first ground contact pad, all exposed at a first surface of the first power transistor die that faces toward the mounting surface of the module substrate;
a second amplifier path that includes a second input, second output, and a second power transistor die coupled to the mounting surface, wherein the second power transistor die has a third I/O contact pad coupled to the second input, a fourth I/O contact pad coupled to the second output, and a second ground contact pad, wherein the third and fourth I/O contact pads are exposed at a first surface of the second power transistor die that faces away from the mounting surface of the module substrate, and the second ground contact pad is exposed at a second surface of the second power transistor die that faces toward the mounting surface of the module substrate; and a combining node is electrically coupled to the first and second outputs of the first and second amplifier paths.

15. The Doherty amplifier module of claim 14, wherein:
a first amplifier path that includes a third power transistor die coupled in series with the first power transistor die, wherein the third power transistor die includes a fifth I/O contact pad coupled to the first input, a sixth I/O contact pad coupled to the first I/O contact pad of the first power transistor die, and a third ground contact pad, wherein the fifth and sixth I/O contact pads are exposed at a first surface of the third power transistor die that faces away from the mounting surface of the module substrate, and the third ground contact pad is exposed at a second surface of the third power transistor die that faces toward the mounting surface of the module substrate.

16. The Doherty amplifier module of claim 15, wherein:
a first amplifier path is a peaking amplifier path; and
a second amplifier path is a carrier amplifier path.

17. The Doherty amplifier module of claim 15, wherein:
a first amplifier path is a carrier amplifier path; and
a second amplifier path is a peaking amplifier path.

18. The Doherty amplifier module of claim 14, wherein:
a first amplifier path that includes a third power transistor die coupled in series with the first power transistor die, wherein the third power transistor die includes a fifth I/O contact pad coupled to the first input, a sixth I/O contact pad coupled to the first I/O contact pad of the first power transistor die, and a third ground contact pad, wherein the fifth and sixth I/O pads and the third ground contact pad are all exposed at a first surface of the third power transistor die that faces toward the mounting surface of the module substrate.

19. The Doherty amplifier module of claim 18, wherein:
the second amplifier path that includes a fourth power transistor die coupled in series with the second power transistor die, wherein the fourth power transistor die includes a seventh I/O contact pad coupled to the second input, an eighth I/O contact pad coupled to the third I/O contact pad of the second power transistor die, and a fourth ground contact pad, wherein the sixth and seventh I/O pads and the fourth ground contact pad are all exposed at a first surface of the fourth power transistor die that faces toward the mounting surface of the module substrate.

20. The Doherty amplifier module of claim 14, further comprising:
a phase shift and impedance inversion element electrically coupled between the first and second outputs of the first and second amplifier paths; and
a power splitter with an input terminal configured to receive an input radio frequency (RF) signal, a first output terminal coupled to the first input of the first amplifier path, and a second output terminal coupled to the first input of the second amplifier path.

* * * * *

UNITED STATES PATENT AND TRADEMARK OFFICE
CERTIFICATE OF CORRECTION

PATENT NO. : 11,587,852 B2
APPLICATION NO. : 17/205390
DATED : February 21, 2023
INVENTOR(S) : Vikas Shilimkar et al.

Page 1 of 1

It is certified that error appears in the above-identified patent and that said Letters Patent is hereby corrected as shown below:

In the Claims

At Column 38, Line 27, Claim 20 should be "the second input of the second amplifier path."

Signed and Sealed this
Twenty-eighth Day of January, 2025

Coke Morgan Stewart
*Acting Director of the United States Patent and Trademark Office*